(12) United States Patent
Bozano et al.

(10) Patent No.: US 9,057,960 B2
(45) Date of Patent: Jun. 16, 2015

(54) RESIST PERFORMANCE FOR THE NEGATIVE TONE DEVELOP ORGANIC DEVELOPMENT PROCESS

(71) Applicant: International Business Machines Corporation, Armonk, NY (US)

(72) Inventors: Luisa D. Bozano, Armonk, NY (US); Dario L. Goldfarb, Armonk, NY (US); Linda K. Sundberg, Armonk, NY (US); Hoa D. Truong, Armonk, NY (US); Hsinyu Tsai, Armonk, NY (US); Gregory M. Wallraff, Armonk, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/831,570

(22) Filed: Mar. 14, 2013

(65) Prior Publication Data

US 2014/0220495 A1    Aug. 7, 2014

Related U.S. Application Data

(60) Provisional application No. 61/760,451, filed on Feb. 4, 2013.

(51) Int. Cl.
*G03F 7/26*    (2006.01)
*G03F 7/32*    (2006.01)
*G03F 7/20*    (2006.01)

(52) U.S. Cl.
CPC . *G03F 7/325* (2013.01); *G03F 7/20* (2013.01)

(58) Field of Classification Search
CPC ......... G03F 7/425; G03F 7/0233; G03F 7/40; G03F 7/004; G03F 7/11; G03F 7/168; G03F 7/2024; G03F 7/322; G03F 7/38; G03F 7/0045; G03G 9/08795; G03G 9/09775; G03G 9/09783; H01L 21/31133; H01L 21/31144; H01L 51/0035; H01L 21/312; B41C 1/1008; B41C 1/1016; B41C 2210/04; B41C 2210/06; B41C 1/10; C07C 37/86; C07C 45/85
USPC .................................. 430/311, 322, 331, 325
See application file for complete search history.

(56) References Cited

U.S. PATENT DOCUMENTS

| 4,454,222 A | 6/1984 | Tada et al. | |
|---|---|---|---|
| 4,822,722 A | 4/1989 | Lewis et al. | |
| 5,731,126 A * | 3/1998 | Takemura et al. | 430/270.1 |
| 5,994,022 A * | 11/1999 | Tanabe et al. | 430/170 |
| 7,851,140 B2 | 12/2010 | Tsubaki | |
| 2002/0102490 A1 | 8/2002 | Ito et al. | |
| 2006/0024616 A1* | 2/2006 | Clark et al. | 430/311 |
| 2006/0166147 A1 | 7/2006 | Chen | |
| 2007/0041698 A1* | 2/2007 | Maeda et al. | 385/141 |
| 2008/0187860 A1 | 8/2008 | Tsubaki et al. | |
| 2008/0261150 A1 | 10/2008 | Tsubaki et al. | |
| 2008/0318171 A1 | 12/2008 | Tsubaki | |
| 2009/0011366 A1 | 1/2009 | Tsubaki et al. | |
| 2009/0042147 A1 | 2/2009 | Tsubaki | |
| 2010/0040971 A1 | 2/2010 | Tarutani et al. | |
| 2010/0040972 A1 | 2/2010 | Tarutani et al. | |
| 2010/0239984 A1 | 9/2010 | Tsubaki | |
| 2010/0273110 A1 | 10/2010 | Ogihara et al. | |
| 2010/0323305 A1 | 12/2010 | Tsubaki et al. | |
| 2010/0330507 A1 | 12/2010 | Tsubaki et al. | |
| 2011/0020755 A1 | 1/2011 | Tsubaki | |
| 2011/0147984 A1 | 6/2011 | Cheng et al. | |
| 2012/0064456 A1 | 3/2012 | Bae et al. | |
| 2012/0107747 A1 | 5/2012 | Lee et al. | |
| 2012/0219755 A1* | 8/2012 | Bae et al. | 428/141 |
| 2013/0017492 A1 | 1/2013 | Hatakeyama et al. | |

FOREIGN PATENT DOCUMENTS

| EP | 0211350 | 2/1987 |
|---|---|---|
| JP | 2004-163877 | * 6/2004 |

OTHER PUBLICATIONS

International Searching Authority; International Search Report; PCT/US14/00017;May 15, 2014; 21pp.
Lahav, et al. Patterning of Poly(acrylic acid) by Ionic Exchange Reactions in Microfluidic Channels, Advanced Materials,Nov. 10, 2006,18, pp. 3174-3178, Wiley, Weinheim, Germany.

* cited by examiner

*Primary Examiner* — Caleen Sullivan
(74) *Attorney, Agent, or Firm* — Robert J. Eichelburg; The Law Offices of Robert J. Eichelburg

(57) ABSTRACT

A process and composition for negative tone development comprises providing a photoresist film that generates acidic sites. Irradiating the photoresist film patternwise provides an irradiated film having exposed and unexposed regions where the exposed regions comprise imaged sites. Baking the irradiated film at elevated temperatures produces a baked-irradiated film comprising the imaged sites which after irradiating, baking, or both irradiating and baking comprise acidic imaged sites. Treating the baked-irradiated film with a liquid, gaseous or vaporous weakly basic compound converts the acidic imaged sites to a base treated film having chemically modified acidic imaged sites. Applying a solvent developer substantially dissolves regions of the film that have not been exposed to the radiant energy, where the solvent developer comprises a substantial non-solvent for the chemically modified acidic imaged sites. One-step simultaneous base treatment and solvent development employs a composition comprising a mix of the basic compound and solvent developer.

30 Claims, 13 Drawing Sheets

RESIST PERFORMANCE FOR THE NEGATIVE TONE DEVELOP ORGANIC DEVELOPMENT PROCESS

RELATED APPLICATIONS

This application is a Non-Provisional application based on and claiming priority from Provisional Application 61/760,451, filed Feb. 4, 2013, which is incorporated herein by reference in its entirety.

FIELD OF THE INVENTION

The field of the invention comprises improved processes and compositions for negative tone development employing a non-aqueous developer to produce high resolution negative-tone images using a photoresist.

BACKGROUND OF THE INVENTION

The realization of advanced lithographic technology beyond the 14 nm node requires the implementation of patterning materials and processes with ultimate performance in order to cope with intrinsically contrast-limited exposure tools. The reduction in imaging wavelength from the long-standing 193 nm ArF Lithography (DUV) to the expected 13.5 nm Extreme Ultraviolet Lithography (EUV) will improve the resolving power of ultimate optical systems used by the semiconductor industry, and is expected to enable the extension of Moore's Law to the 10 nm node and beyond.

The optical resolving power of ArF and EUV scanners can only be realized as a material pattern formed on a semiconductor substrate if the spatial resolution of the imaging material is commensurate to the quality of the delivered aerial image. At the same time, the imaging layer is required to carry acceptable sensitivity to the imaging wavelength and provide low line-width roughness (LWR), good adhesion to the underlying substrate and large post apply bake (PAB) and post exposure bake (PEB) latitude. Chemically amplified resists have become the workhorse of the lithographic industry due to the ability to satisfy the aforementioned requirements in a sustainable manner across multiple technology nodes.

Utilizing chemically-amplified (CA) resists is typically considered within the context of positive-tone resist imaging and development, where the exposed regions of a photoresist are removed by an aqueous basic developer (tetraalkylammonium hydroxide (TMAH)) after a post-exposure bake (PEB) step, while the unexposed regions remain insoluble. This is referred to as positive-tone development (PTD).

One way to reverse the tone of a chemically amplified resist originally designed to be developed in the positive tone with aqueous base developer is to utilize an organic developer that removes the unexposed portion of the resist film, while the exposed regions remain unaffected. This process is known as negative-tone development (NTD) and has found extensive applications in the area of 193 nm double patterning using bright field masks, particularly in the case of small feature openings such as contact hole and trench patterning. Hereinafter, NTD will be used to refer exclusively to refer to the use of organic solvents as developers to produce negative-tone images.

The resist contrast of the NTD process is determined by the solubility differences between the relatively nonpolar unexposed resist and the more polar resist material that is generated in the exposed regions of the film. As mentioned previously, in the NTD process the organic solvent dissolves the unexposed areas, and creates a negative image of the exposed chemically amplified photoresist. Processing of a chemically amplified resist in a NTD fashion utilizing anisole as the organic solvent developer was first reported by J. G. Maltabes, S. J. Holmes, J. R. Morrow, R. L. Barr, M. Hakey, G. Reynolds, W. R. Brunsvold, C. G. Wilison, N. Clecak, S. MacDonald, and H. Ito, *1x Deep UV Lithography With Chemical Amplification for 1-Micron DRAM Production*, SPIE Vol. 1262, Advances in Resist Technology and Processing VII (1990), pp. 2-7.

There are a number of limitations, however, with the industrial application of NTD. Due to toxicological, environmental, and especially flammability issues there are a limited number of organic solvents that are compatible with semiconductor manufacturing. This is a serious impediment to finding the optimum developing solvent for a given resist. At this time it appears there are less than 6 organic solvents that are usable on fabrication development tracks.

Current high performance resists are highly optimized for development in aqueous TMAH developer. Many positive-tone resists perform poorly in negative tone development. Some don't work at all, and many functional resists exhibit significant defect, profile and film thinning problems in the exposed areas. Radical changes in the photoresist chemistry to improve NTD performance in acceptable NTD developing solvents would require extensive work to match the positive-tone performance that has been optimized over the last three decades.

There exists a need in the industry for a generalized process to improve the NTD performance of a CA resist developed with organic solvent to provide a negative tone image. The detailed materials and process to accomplish this will be disclosed below.

SUMMARY OF THE INVENTION

The present invention comprises compositions, structures, articles of manufacture, processes and products produced by the processes that address the foregoing needs, and provides improved negative tone development (NTD) performance to produce a high resolution negative tone image in a photoresist using an organic solvent developer, i.e., a NTD solvent.

The invention in one embodiment comprises treating a photoresist (after exposure and optional post exposure bake but prior to organic solvent development) by contacting the imaged resist film with a basic compound that converts the organic acidic species comprising the latent chemical image into one of reduced solubility in organic solvent developer.

This treatment of the resist to improve NTD performance can be carried out in several ways.

The exposed and baked resist may be treated with a solution of an aqueous dilute base, i.e., a basic compound, such that none of the exposed film is dissolved but sufficient base penetrates the film so as to increase the resist contrast in the subsequent NTD process. Without being bound by any theory, it is presumed that the improvement is the result of generation of ionic species in the imaged features due to the interaction of the basic compound with the pendant acidic groups in the exposed photoresist material.

We employ Bronsted bases as the basic compound, e.g., both ionic Bronsted bases and non-ionic Bronsted bases both of which are known in the art. Bronsted bases include N-bases, e.g. nitrogen compounds comprising ammonia, hydroxylamine, or an organic nitrogen compound. We can employ the nitrogen compound as a solution. In one example, we employ the organic nitrogen compound as a dilute aqueous solution, such as a dilute aqueous solution of TMAH. The Bronsted bases or basic compound also comprises metal based compounds that include monovalent or multivalent metal ions. We also use the metal based compounds in solution based on solvents comprising water or mixtures of water with organic solvents, e.g., polar organic solvents, and combinations thereof. Non-ionic organic Bronsted bases may comprise N-bases such as phosphazenes, e.g., BTPP, $P_1$-t-Bu, BEMP, BEMP on PS, $P_1$-t-Oct, $P_2$Et, $P_2$-t-Bu, $P_2$-t-Bu on PS, $P_2$—F, $P_4$-t-Bu, $P_4$-t-Oct, and $P_5$—F, respectively Sigma-Aldrich Product #'s 79432, 445363, 360007, 536490, 79412, 420425, 79416, 71477, 52585, 79421, 79422 and 87652, and their art-known equivalents and combinations thereof.

Hydroxides or art-known organic acid salts or other salts of Group IA, or Group IIA metals, Lanthanides or zinc or other metals can be used as the metal based compound. In one embodiment the organic acids used to form these salts comprise the lower molecular weight organic acids, e.g., those having up to about 8 carbon atoms such as formic or acetic acid, as well as propionic acid, butyric acid, pentanoic acid, hexanoic acid, heptanoic acid, octanoic acid, and the like and the isomers thereof, and combinations thereof. The other salts that may be formed with these metals comprise the nitrogen acid salts, such as salts formed by reacting these metals with nitric, nitrous, or hyponitrous acid and combinations thereof.

Group IA and Group IIA metals used in this regard comprise, e.g., lithium, potassium, sodium and calcium, as well as zinc or the Lanthanides and other metal ions that are known to bind to weakly acidic exchange resins. Multivalent ions based on amines or metals such as zinc or lanthanum are particularly useful as they could potentially form crosslinked polymer salt networks potentially improving resist contrast.

In a second embodiment, the exposed resist can also be treated with a vapor or a gas comprising ammonia, hydroxylamine, an organic amine, e.g., a monovalent or multivalent organic amine to create metal free salts that improve resist contrast when developed with organic solvents. If solutions of ammonia, hydroxyl amine, a monovalent or multivalent organic amine are employed they can be comprised of carrier organic solvents, such as polar organic solvents, water or mixtures thereof. Examples of suitable carrier organic solvents are the lower alkanols, e.g., those having up to about 8 carbon atoms, which are substantially non solvents for the resist, such as methanol, and ethanol, as well as propanol, butanol, pentanol, hexanol, heptanol, octanol and the like and the isomers thereof, and combinations thereof. The role of the carrier solvent is to act as a transport solvent for the basic compound to be incorporated into the resist film.

In a third embodiment, instead of a basic compound treatment prior to NTD development, as described in the first and second embodiments, the basic compound (e.g., Bronsted base) is combined directly with the NTD solvent to allow for a one step development process. In this single step NTD process we select the organic NTD solvent and the Bronsted base so that a chemical polarity change can occur in the exposed acidic sites faster than the rate of film dissolution and development and increase improved contrast and performance. We use the Bronsted bases in combination with or dissolved in substantially anhydrous solvents comprising polar organic solvents such as the lower alkanols described herein or NTD solvents also described herein and their equivalents, or combinations of these lower alkanols and NTD solvents.

Other additives (e.g. surfactants) known in the art to improve the transport of the basic species into the resist film can also be employed in any of the processes described above, either in aqueous or polar organic solvents.

The contrast curves and images shown in the drawings illustrate the invention. Some of these contrast curves reflect the results of experiments in which we exposed a model resist and fully formulated resists by rinsing them with dilute aqueous base solution and then developed in the indicated solvents. Another contrast curve illustrates the process of the invention using an anhydrous solution of an organic NTD solvent with a dissolved Bronsted base such that the salt-formation process occurs during the NTD process itself.

By using the processes and compositions of the present invention, an improvement in NTD patterning performance can be achieved for materials that are not compatible with the organic development process.

BRIEF DESCRIPTION OF THE DRAWINGS

The accompanying drawings set out the invention, and are included to illustrate various embodiments of the invention, and together with this specification also serve to explain the principles of the invention. These drawings comprise various Figures that illustrate a process to improve the patterning performance of a photoresist in negative tone development to produce a high resolution negative tone image in a photoresist.

FIGS. 1-12 comprise contrast curves and photomicrographs of photoresist films treated according to the process of the present invention, i.e.

FIG. 2 illustrates contrast curves at 248 nm (KrF) of KRS-XE with and without pre-rinse with dilute TMAH prior to NTD with methyl benzoate (MeB);

FIG. 4 illustrates contrast curves at 248 nm (KrF) of experimental resist using a standard methyl benzoate (MeB) NTD process and inventive processes comprising a pre-rinse with 0.002N TMAH solution prior to NTD;

FIG. 5 illustrates contrast curves at 248 nm (KrF) of experimental resist A using a standard 2-heptanone NTD process and inventive processes comprising a pre-rinse with 0.002N TMAH solution prior to NTD;

FIG. 7 illustrates EUV contrast curves of experimental resist using NTD developer methyl benzoate and inventive process with 0.0016N TMAH rinse prior to NTD with methyl benzoate;

FIG. 10 illustrates contrast curves of commercial 193 nm resist at 193 nm (ArF) exposure using NTD developer n-butyl acetate (NBA) and inventive process with 0.000325N TMAH rinse prior to NTD with n-butyl acetate;

FIG. 11 illustrates commercial resist exposed ax 248 nm and developed in 2-Heptanone/4M2P (1:5 ratio) with different tetraalkyi ammonium hydroxides. Increased NTD contrast and reduced top loss when using NTD solvent with added tetraalkl ammonium hydroxides. Increased NTD contrast and reduced top loss when using NTD solvent with added tetraalkyl ammonium hydroxide;

FIG. 12 illustrates contrast curves of commercial 193 nm resist at 193 nm (ArF) exposure using NTD developer n-butyl acetate (NBA) and inventive process with vapor phase treatment using ammonium hydroxide prior to NTD with n-butyl acetate.

DETAILED DESCRIPTION OF THE INVENTION

Figure 1A:
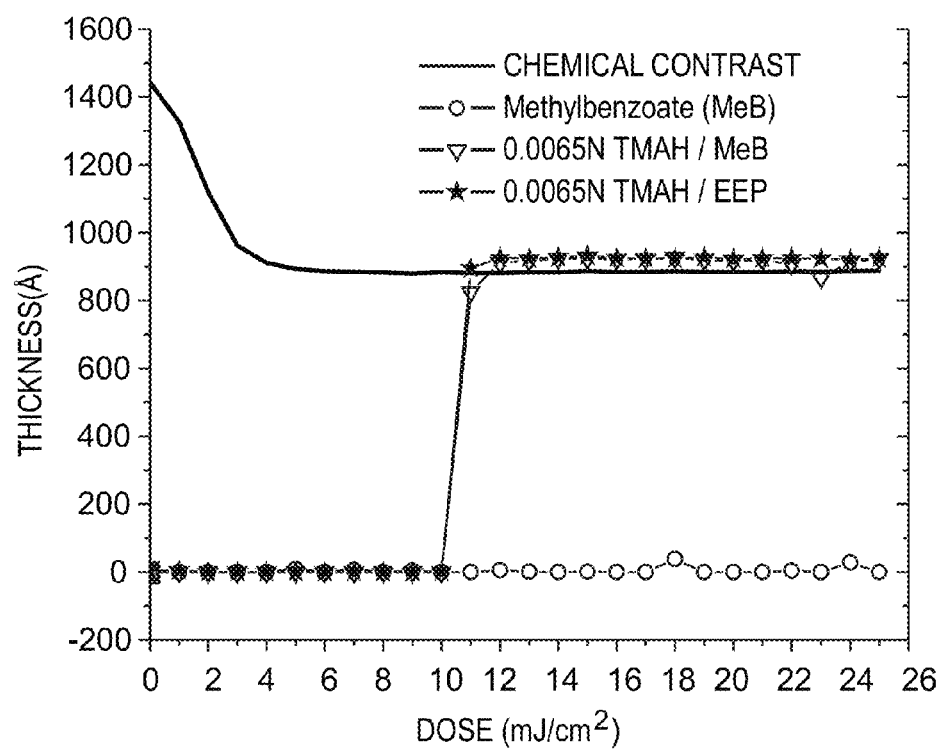
FIG. 1A illustrates PBOCST (poly(tert-butoxyoxycarbonylstyrene)) contrast curves at 248 nm exposure (KrF) illustrating standard NTD, and two examples of the inventive process.

To achieve the foregoing and other advantages, and in accordance with the purpose of this invention as embodied and broadly described herein, the following detailed description comprises disclosed examples of the invention that can be embodied in various forms.

The specific processes, compounds, compositions, and structural details set out herein not only comprise a basis for the claims and a basis for teaching one skilled in the art to employ the present invention in any novel and useful way, but also provide a description of how to make and use this invention. The written description, claims, abstract of the disclosure, and the drawings that follow set forth various features, objectives, and advantages of the invention and how they may be realized and obtained. These features, objectives, and advantages will also become apparent by practicing the invention.

The invention in one aspect comprises using inorganic or organic Bronsted bases to treat exposed photoresist films prior to negative-tone development with an organic solvent. Without being bound by any theory, the generation or formation of ionic species or counterions (e.g. salts) in the exposed areas of the chemically amplified photoresist film improves the patterning performance (e.g. resist contrast) in organic solvent developers used in NTD. In particular, typical photoresists comprise polymer-bound acidic groups in the exposed regions after exposure and an optional post exposure bake (PEB) either or both of which result in acidolysis of protecting groups (such as tertiary esters or acetals). Converting these resist-bound acidic groups into ionic species (e.g. salts) through their reaction with a Bronsted base renders the photoresist significantly less soluble in the organic solvent developer than the exposed photoresist itself thus improving the resist contrast.

In one embodiment, the inventive process comprises an improved process of producing negative-tone photoresist pattern using a photoresist developed with an organic solvent developer comprising the steps of:

(a) providing a photoresist film that can be processed to generate acidic sites;

(b) irradiating the photoresist film with radiant energy to provide an irradiated film having exposed and unexposed regions in said film, the exposed regions comprising imaged sites;

(c) optionally baking the irradiated film at elevated temperatures to produce a baked irradiated film comprising the imaged sites:

(d) the imaged sites comprise acidic sites formed after irradiating or both irradiating and baking;

(e) contacting the irradiated film with a basic compound, without dissolving the film, to form a base treated film;

(f) Optionally rinsing the base treated film in water or other solvent;

(g) developing the treated film with an organic solvent developer that substantially dissolves regions of the film that have not been exposed to the radiant energy to produce a negative-tone image.

We previously described the basic compound and noted the use of alcohols as carrier solvents is determined by their solubility in water. We select alcohols in this regard from (but are not limited to) those listed below which also includes their solubility in water (in parentheses) at 20 degrees Celsius:

Methanol (miscible), ethanol (miscible), 1-propanol (miscible), 2-propanol (miscible), 2-methyl-1-propanol (87 g/liter), 1-butanol (8.3 g/liter), 2-butanol (200 g/liter), tert-butanol (miscible), 1-pentanol (22 g/liter), 2-pentanol (45 g/liter), 3-pentanol (59 g/liter), 2-methyl-2-butanol (120 g/liter), 2-methyl-1-butanol (31 g/liter), 3-methyl-1-butanol (28 g/liter), 3-methyl-2-butanol (59 g/liter), cyclopentanol (36 g/liter), cyclohexanol, 1-hexanol (5.9 g/liter), 2-ethyl-1-butanol (10 g/liter), 2-methyl-1-pentanol (8.1 g/liter), 2-methyl-2-pentanol (33 g/liter), 2-methyl-3-pentanol (20 g/liter), 3-methyl-2-pentanol (19 g/liter), 3-methyl-3-pentanol (45 g/liter), 4-methyl-1-pentanol (7.6 g/liter), 4-methyl-2-pentanol (15 g/liter), 1-heptanol (0.1 g/liter) and 1-octanol (0.3 g/liter).

Importantly the basic compound must not dissolve the underlying resist, but only act as a carrier of basic species to be incorporated into the resist film.

The applicability of organic or inorganic Bronsted bases is determined by their basicity, as well as their solubility in the carrier solvent if organic solvents, e.g., polar organic solvents, water, or their mixtures are employed.

In general, the organic amine bases employed according to the invention comprise N-bases, e.g., compounds having the formulae $RNH_2$, $RR'NH$, $RR'R''N$, and $RR'R''R'''N^+ X^-$, where R, R', R", and R''' are the same or different organo substituents, or organo substituents that can be joined together, and $X^-$ may comprise $OH^-$ a halogen or other art-known quaternary ammonium cationic species. These bases may also comprise heterocyclic nitrogen compounds known in the art, some of which we describe herein.

In particular, quaternary ammonium salts, such as the tetraorganoammonium hydroxide salts $R_4N^+OH^-$, where R can be an alkyl group having up to about 18 carbon atoms or an aromatic group including lower alkyl substituted aromatic groups having up to about ten carbon atoms or combinations of both of such alkyl and aromatic groups, are particularly useful in the present invention. The $OH^-$ anion of these salts alternatively can be any quaternary ammonium anion known in the art such as those used in the examples of the present invention as well as other known anions which we select so as not to interfere with the function of the substrate or wafer on which the process is used (e.g., microelectronic devices [MEMS] such as a semiconductor, and the like). Combinations of these salts may also be used in the invention.

As noted, cations of Group IA metals and Group IIA metals can be used as the counterion, as well as other multivalent metals, e.g., Zn and the Lanthanides such as La, or the other Lanthanide metals (i.e., metals having atomic numbers 58 to 71). The metal salt or metal hydroxide solution of these metals would have to be compatible with the microelectronic sub-structures already present in the semiconductor wafer in a way that the metal ions or anions should not introduce unwanted doping or poisoning in the existing semiconductor devices or other microelectronic devices or other substrates the invention is used on. The same criteria apply for nitrogen compounds such as ammonia and the amines used according to the invention.

The polyvalent inorganic bases as well as any polyvalent organic nitrogen compounds described herein can enter into cross-linking reactions (e.g., via salt bridges) with the deprotected photoresist which provides another benefit to the process of the invention.

Some nitrogen-containing Bronsted bases useful according to the invention can be selected from (but are not limited to): hydroxylamines known in the art such as N-Methyl hydroxylamine hydrochloride and hydroxylamine as well as, methylamine, ethylamine, dimethylamine, propylamine, trimethylamine, 1,3-propanediamine, 1,2,3-triaminopropane, pyrrolidine, morpholine, piperidine, n-butylamine, tert-butylamine, diethylamine, 1,4-butanediamine, piperidine, n-pentylamine, diethylmethylamine, cyclohexylamine, n-hexylamine, triethylamine, benzylamine, aniline, imidazole, pyrazole, and ethylenediamine. It should be understood that a wide variety of basic nitrogen compound may be used in this invention. Amines are further described by Morrison and Boyd, *ORGANIC CHEMISTRY Second Edition*, (1966), Chapter 22 et seq. which also lists at pp. 720-721, some amines that can be selected for use in the present invention.

The concentration of the Bronsted base in solution can vary from about 0.00001N to about 0.23N or about 0.00001N to about 0.01N. and the contact time on the substrate can vary from about 1 second to about 5 minutes depending on concentration of the Bronstead base and the treatment process employed. Preferably, the contact time is less than 120 seconds. Subsequent organic solvent development can also vary over these time spans, with the objective being to adjust concentrations and exposure times sufficiently to obtain the desired performance.

When treating the deprotected or exposed resist films with gaseous or vaporous solutions of non-metallic Bronsted bases according to the invention, we use solutions of these bases at elevated temperatures at atmospheric, sub atmospheric or super atmospheric pressures, where the temperature of the Bronsted bases or solutions thereof is sufficiently high to convert the liquidus phase to the gaseous or vaporous phase, but not above a temperature that would adversely affect the Bronsted bases, photoresist or the substrate on which we apply the photoresist. The pressures employed in this regard comprise from about 0.1 atmosphere to about 10 atmospheres, and the time of treatment adjusted to substantially react the areas of deprotected photo resist with the counterions. We conduct the sub atmospheric and super atmospheric processes in an autoclave.

In another aspect of the invention some suitable organic solvents or NTD solvents for the NTD portion of the present invention comprise solvents having a carbonyl or ether group such as for example Methyl benzoate (MeB), Ethyl 3-ethoxypropionate (EEP), 2-Heptanone (MAK), 4-Methyl-2-pentanone (4M2P), N-butyl acetate (NBA), Anisole, Acetophenone, their equivalents, and combinations thereof.

In a second embodiment, the inventive process comprises a process of producing negative-tone photoresist pattern using a photoresist developed with an organic solvent developer comprising the steps of:

(a) providing a photoresist film that can be processed to generate acidic sites;

(b) irradiating the photoresist film with radiant energy to provide an irradiated film having exposed and unexposed regions in the film, the exposed regions comprising imaged sites;

(c) optionally baking the irradiated film at elevated temperatures to produce a baked irradiated film comprising the imaged sites:

(d) the imaged sites comprise acidic sites formed after the irradiating or both the irradiating and the baking;

(e) contacting the irradiated film with a basic compound, without dissolving said film, to form a base treated film (the basic compound may be in the gaseous or vaporous phase);

(f) developing the treated film with an organic solvent developer to preferentially remove regions of the film that have not been exposed to the radiant energy to produce a negative-tone image.

In a third embodiment, we employ a one-step process in which the NTD developer comprises a mix, i.e., a combination of the organic NTD solvent described herein and a basic compound described herein such that the polarity improvement occurs during the NTD process itself. In this one-step process, the organic NTD solvent and the basic compound, in one embodiment, are selected so that change in polarity (due to the basic compound) of exposed regions occurs before film dissolution and development.

Suitable photoresist films for the inventive processes described herein that can be processed to generate acidic sites are well known in the art, such as those based on polyhydroxystyrene (PHOST) or acrylic polymers (e.g., photoresists based on acrylate or methacrylate functionality), and those containing moieties comprised of alicyclic groups or heterocyclic groups containing oxygen, fluorine, nitrogen or sulfur atoms. A wide variety of suitable photoresists have been described by H. Ito *Chemical Amplification Resists for Microlithography, Adv. Polym. Sci.* 2005, 172, 37-245.

The photoresist may also be comprised of condensation polymers of phenolic compounds (e.g., novolacs), which are the reaction products of an aldehyde such as acetaldehyde or formaldehyde, and a phenol such as phenol itself, or phenol substituted with 1 or 2 alkyl groups of 1 to about 9 carbon atoms each, e.g., o-, m-, and p-cresol, the xylenols, p-tert-butyl phenol, and p-nonylphenol, p-phenyl-phenol, resorcinol, bis(4-hydroxyphenyl)methane, and bis(4-hydroxyphenyl)$_2$-propane, or poly(norbornene)-co-maleic anhydride polymers.

A key ingredient of the photo resist compositions used in practicing the invention comprises the so-called photochemical acid generator (PAG) and usually take the form of iodonium ($R_2I^+$ $X^-$) or sulfonium ($R_3S^+$ $X^-$) salts, where X is a halogen, e.g., chlorine. These compounds decompose upon light exposure to provide a complicated combination of products, chief among which is the acid HX. This acid then catalyzes the deprotection reaction that removes the protecting group on the photoresist compounds, such as the organooxycarbonyloxy or ketal groups on the hydroxylated styrene polymers described herein. Ohasi et al., United States Patent Publication No. 20080008965, paragraphs [0095] to [0117] describe PAGs. Okeda et al. et al., United States Patent Publication No. 20070146887, paragraphs [0953] to [0959] also describe PAGs. The photoacid generator may be bound to the photoresist material, preferably through the anion. These resists are referred to as polymer-bound PAG photoresists and have been commonly used for EUV lithography.

The radiant energy source can be any one of UV, DUV, EUV, or electron beam energy. The invention can also be used with exposures comprising visible light. The radiant energy can be generated with a laser based on the rare gasses listed in Group VIIIA of the Periodic Table of the Elements, e.g., He, Ne, Ar, Kr, or Xe. Although Rn is a rare gas, it is avoided because of its radioactivity. Excimers of the rare gasses, sometimes referred to as exiplexes are also suitable, such as the halogen excimers, e.g., fluorine excimers, such as ArF and KrF.

The substrate may also comprise an anti-reflective coating, an organic planarizing layer, a hardmask, a dielectric layer, a metal layer and other art-known substrates in the field of microelectronics. After the negative-tone process, the resist pattern may be transferred into the underlying substrate using an etch process such as reactive ion etching, chemical etching, and the like.

To illustrate the inventive processes, several examples with accompanying Figures are described. The lithographic benefits of using the inventive processes described herein are shown by observing changes in contrast curves and patterning performance. A contrast curve is a graph showing resist thickness (y-axis or ordinate) as a function of dose (x-axis or abscissa). A contrast curve gives information about resist behavior, i.e., which exposure dose (energy) is needed to change the resist solubility in a developer between soluble and insoluble, and resist contrast, referring to the dose range over which this solubility switch will happen (a larger difference in dissolution rate over a narrower dose range indicating higher contrast). The contrast curve may also give information about thickness loss (known as topless or thickness retention) and potential profile issues like footing or scum (due to incomplete dissolution of the interfacial resist region in contact with the underlying film). The term "chemical contrast" also known as "latent image" is the resist film thickness post-exposure and the optional post-exposure bake (PEB), but prior to development. The chemical contrast shows the resist shrinkage due to chemical changes (e.g. volatilization of protecting groups) in the resist film.

In the following examples the resists are all spin coated on top of silicon wafers pre-coated with 63 nm DUV-42P bottom anti-reflective coating (BARC) from Brewer Science unless otherwise stated. To create the contrast curves, the resists are exposed to create an array of open field exposures with varying exposure doses, processed according to given procedure, and the film thickness of each exposure field measured using a NanoSpec 6100 tabletop film analysis system as function of dose. Doses are measured in millijoules per square centimeter (mJ/cm$^2$) for 248 nm, 193 nm and EUV exposures, and in microcoulombs per square centimeter ($\mu$C/cm$^2$) for e-beam exposures. All post-application bakes and post-exposure bakes were for 60 seconds unless otherwise indicated. Linespace resist patterns for 248 nm were exposed using a chrome on glass (COG) darkfield mask unless otherwise indicated. All features were imaged using a scanning electron microscope (SEM).

Example 1A

Four silicon wafers were spincoated with 140 nm of a positive-tone model photoresist formulated from Poly(tert-butoxycarbonylstyrene) (PBOCST) (molecular weight of 15,000 grams per mole (g/mol)) and 5 weight percent of Triphenylsulfonium perfluorobutanesulfonate (TPS-N) in Propylene Glycol Methyl Ether Acetate (PGMEA). After spincoating, the wafers were post-apply baked (PAB) at 110° C. and exposed in a dose array with a 248 nm (KrF) stepper and thereafter subjected to a post-expose bake (PEB) at 120° C. The four wafers were individually processed in four different ways:

Wafer 1) Develop in 0.26N tetramethylammonium hydroxide (TMAH) for 30 seconds and rinsed in water 10 seconds—Standard positive-tone development (PTD) for reference;

Wafer 2) Develop in methyl benzoate (MeB) for 30 seconds—Standard negative tone development (NTD) for reference;

Wafer 3) Rinse with 0.0065N TMAH for 30 seconds and dry prior to development in methyl benzoate (MeB) for 30 seconds;

Wafer 4) Rinse with 0.0065N TMAH for 30 seconds and dry prior to development in ethyl 3-ethoxypropionate (EEP) for 30 seconds.

Contrast curves of the wafers 2-4 are shown in FIG. 1A. The positive-tone contrast curve for wafer 1 was omitted for clarity. As shown in FIG. 1A, PBOCST dissolves at all doses in common NTD developers MeB and EEP (EEP not shown in Figure) indicating it is not compatible with standard NTD processes. In contrast, a rinse with aqueous 0.0065N TMAH rinse solution (wafers 3 and 4, this invention) prior to NTD renders the resist insoluble to the organic solvent developer at a certain exposure dose thereby creating a high contrast negative tone resist pattern.

Example 1B

Three silicon wafers were prepared with a positive-tone PBOCST formulation as described in Example 1A. After PEB, the three wafers were processed in three different ways:

Wafer 1) Rinse with 0.0065N TMAH for 30 seconds and dry prior to development in methyl benzoate (MeB) for 30 seconds;

Wafer 2) Rinse with 0.0065N lithium hydroxide (LiOH) for 30 seconds and dry prior to development in methyl benzoate (MeB) for 30 seconds;

Wafer 3) Rinse with 0.0065N sodium hydroxide (NaOH) for 30 seconds and dry prior to development in methyl benzoate (MeB) for 30 seconds.

Figure 1B:
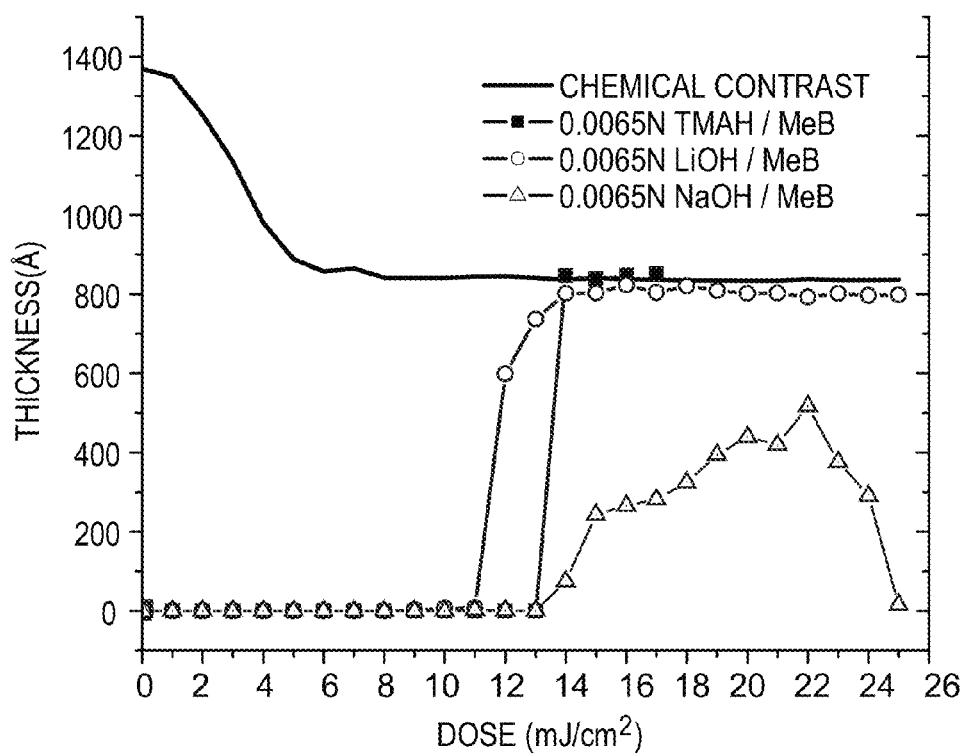
FIG. 1B illustrates PBOCST contrast curves at 248 nm exposure (KrF) illustrating use of the inventive process with different hydroxide salts.

Contrast curves for the three wafers in Example 1B are shown in FIG. 1B. Here three dilute hydroxide solutions with different cations (TMAH, LiOH and NaOH) are used in the inventive process. Without rinse the resist would fully dissolve in methyl benzoate at all doses (as shown in FIG. 1A).

Examples 2-10 (and FIGS. 2-10) similarly illustrate that the rinse compositions and process of the present invention clearly change the dissolution properties of the exposed photoresist in NTD solvent enabling the originally positive-tone photoresist to exhibit high contrast in NTD processes.

Example 2

Three wafers were spin coated with a KRS-XE, a ketal protected poly(hydroxystyrene) positive-tone photoresist, and baked at PAB=90° C. giving a film thickness of 190 nm. The coated wafers were exposed in a dose array with a 248 nm (KrF) stepper and thereafter baked at PEB=90° C. The three wafers were processed in three different ways:

Wafer 1) Develop in 0.26N TMAH for 30 seconds and rinsed in water 10 seconds—Standard positive-tone development (PTD) for reference;

Wafer 2) Develop in methyl benzoate (MeB) for 30 seconds, standard negative tone development (NTD) for reference;

Wafer 3) Rinse with 0.0065N TMAH for 30 seconds and dry prior to development in methyl benzoate (MeB) for 30 seconds.

Figure 2:
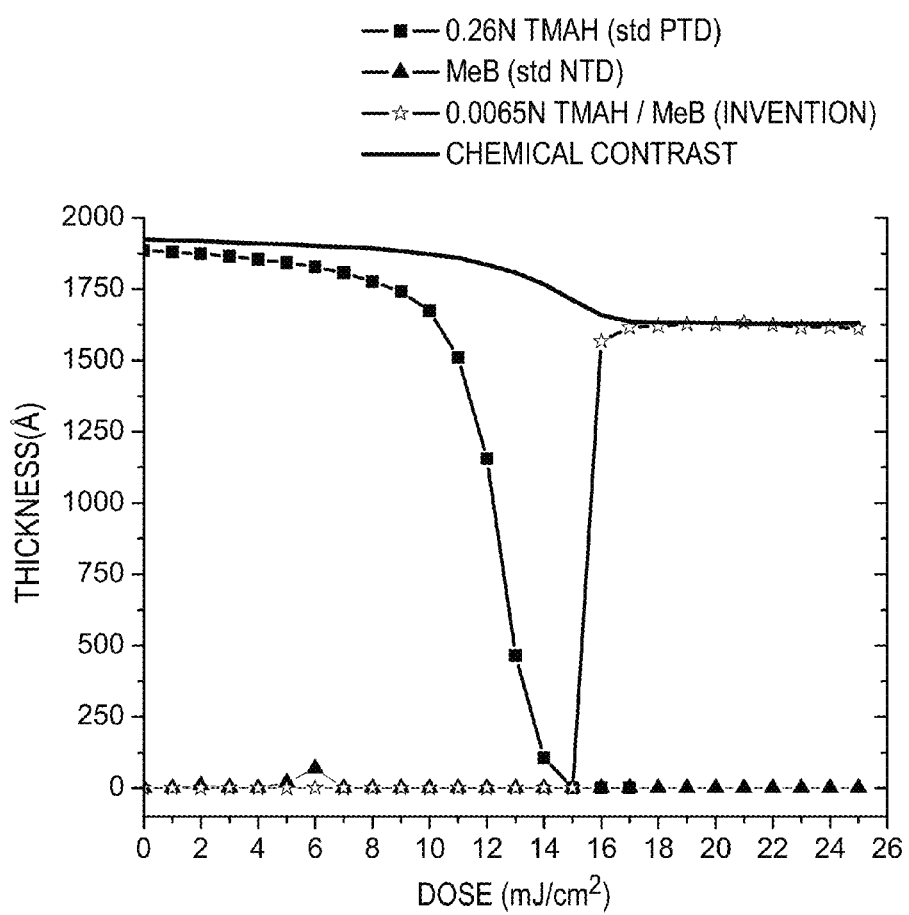

Contrast curves of the three wafers in Example 2 are shown in FIG. 2. Development with 0.26N TMAH developer results in standard positive-tone behavior for KRS-XE, for reference. However, the common NTD developer MeB dissolves the KRS-XE resist at all doses. A rinse with 0.0065N TMAH solution prior to organic solvent development renders the resist insoluble to the organic solvent developer at a certain exposure dose thereby creating a high contrast negative tone resist pattern.

Example 3

Two wafers were spin coated with positive-tone KRS-XE photoresist and baked at PAB=90° C. giving a film thickness of 190 nm. The coated wafers were patternwise exposed with a 248 nm (KrF) stepper and baked at a PEB=90° C. The two wafers were processed in two different ways:
Wafer 1) Develop in methyl benzoate (MeB) for 30 seconds, standard negative tone development (NTD) for reference;
Wafer 2) Rinse with 0.0065N TMAH solution for 30 seconds and dry prior to development in methyl benzoate (MeB) for 30 seconds.

Figure 3B:
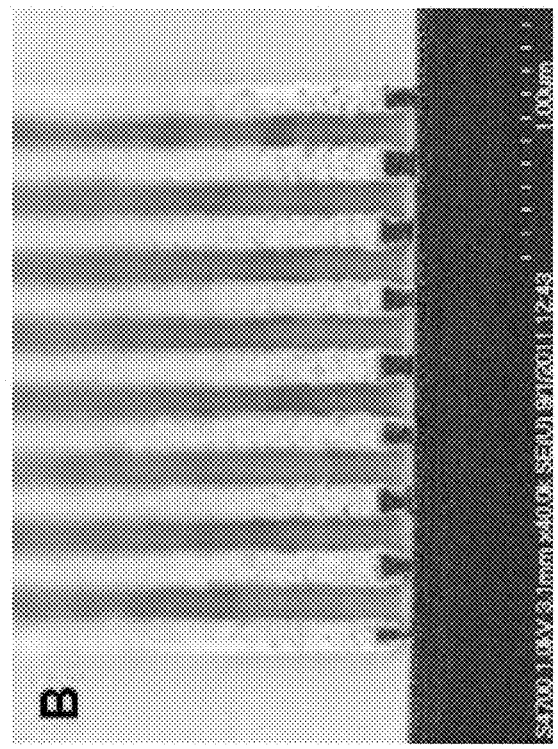
FIG. 3A and FIG. 3B illustrate 150 nm nested lines/space patterns of KRS-XE exposed with 248 nm DUV light (KrF), FIG. 3A showing methyl benzoate NTD process and FIG. 3B the inventive process comprising a rinse with 0.0065N TMAH prior to development with methyl benzoate.
Figure 3A:
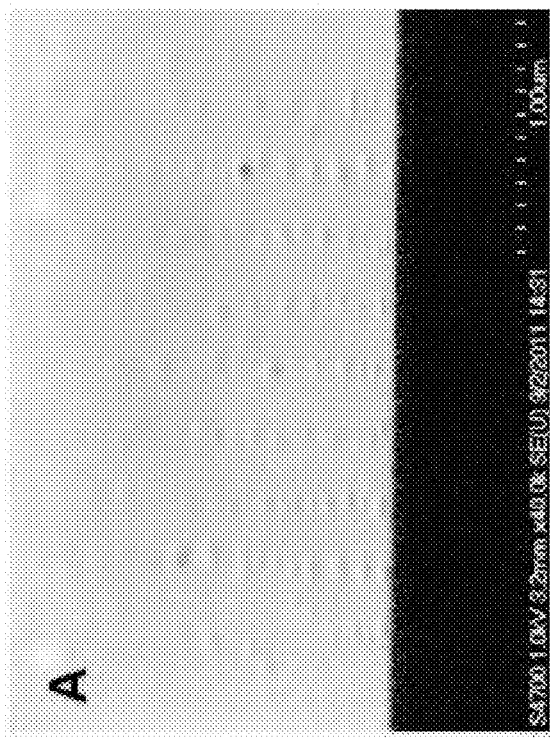

SEM images of the two wafers are illustrated in FIG. 3 with 150 nm features (150 nm line/150 nm space). FIG. 3A shows the methyl benzoate NTD process and FIG. 3B) using the process disclosed in this invention: rinse of the resist with 0.0065N TMAH solution prior to development with methyl benzoate. An improvement in patterning performance is observed using this post-exposure rinse process prior to development in NTD developer.

Example 4

Three wafers were spin coated with an experimental positive-tone resist (EB-P3247 from Shin-Etsu Chemical) and baked at PAB=110° C. giving a film thickness of 80 nm. The coated wafers were exposed with a dose array using a 248 nm (KrF) stepper and thereafter baked at PEB=90° C. The three wafers were processed in three different ways:
Wafer 1) Develop in methyl benzoate (MeB) for 30 seconds, standard negative tone development (NTD) for reference;
Wafer 2) Rinse with 0.0065N TMAH for 30 seconds and dry prior to development in methyl benzoate (MeB) for 30 seconds;
Wafer 3) Rinse with 0.0065N TMAH for 30 seconds, dry and a subsequent rinse with deionized water (DI) for 5 seconds and dry again prior to development in Methyl benzoate (MeB) for 30 seconds.

Figure 4:
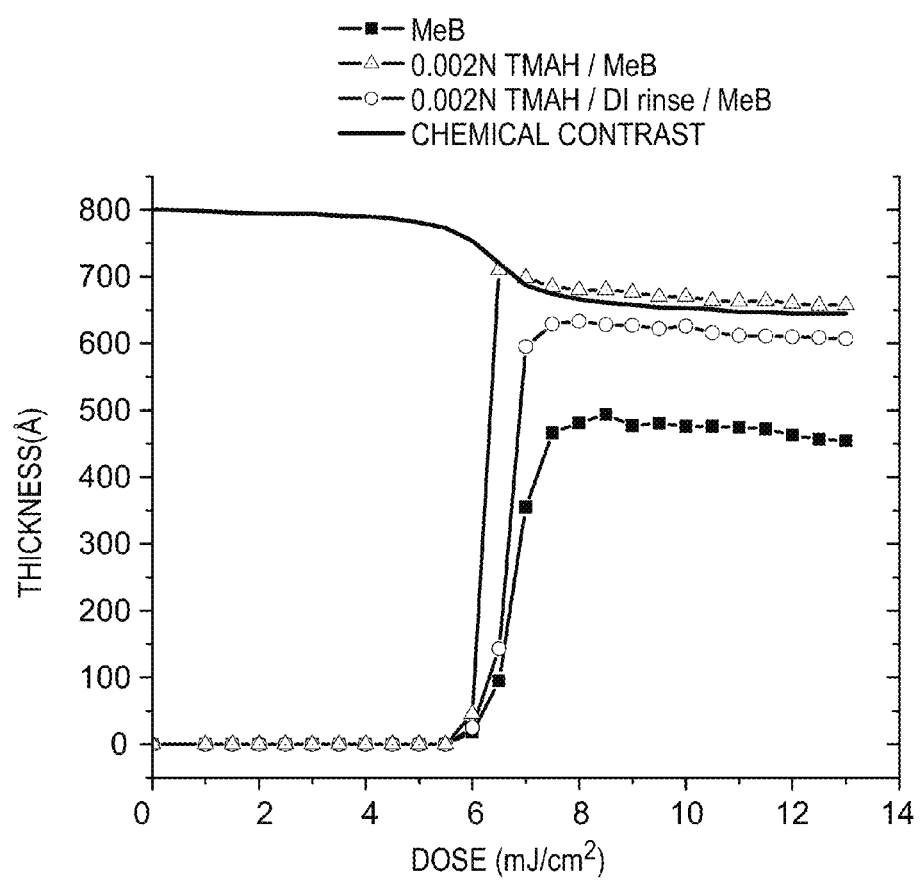

Contrast curves of the three wafers are shown in FIG. 4. The standard NTD process using methyl benzoate results in significant resist toploss (bad thickness retention). In contrast, using the inventive process comprising a rinse with 0.002N TMAH solution prior to development in NTD solvent substantially eliminates this toploss. It should be noted that the treatment with the dilute 0.002N TMAH solution produces minimal thickness changes compared to chemical contrast (solid thick line). In addition, by including a water rinse after treatment with the 0.002N TMAH solution and prior to the organic solvent development provides a means for optional profile control.

Example 5

Similar to Example 4, three wafers were spin coated with an experimental positive-tone resist EB-P3247 (Shin-Etsu Chemical) and baked at PAB=110° C. giving a film thickness of 80 nm. The coated wafers were exposed in a dose array using a 248 nm (KrF) stepper and thereafter baked at PEB=110° C. The three wafers were processed in three different ways:
Wafer 1) Develop in 2-heptanone for 30 seconds, standard negative tone development (NTD) for reference;
Wafer 2) Rinse with 0.0065N TMAH for 30 seconds and dry prior to development in 2-heptanone for 30 seconds;
Wafer 3) Rinse with 0.0065N TMAH for 30 seconds, dry and a subsequent rinse with deionized water (DI) for 5 seconds and dry again prior to development in 2-heptanone for 30 seconds.

Figure 5:
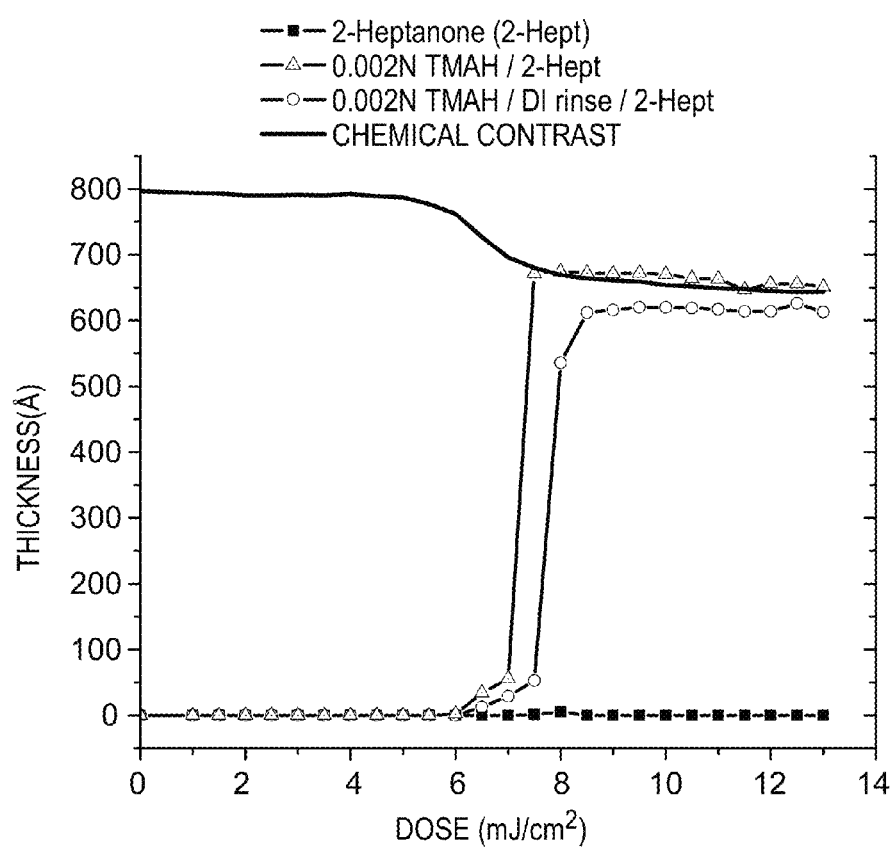

Contrast curves of the three wafers are shown in FIG. 5. Similarly to Example 4 where methyl benzoate was used, this example shows that resist performance using 2-heptanone as a NTD solvent also benefits strongly by a rinse with 0.002N TMAH solution prior to development in NTD solvent. In addition, by including a water rinse after the 0.002 N TMAH rinse, contrast strength can be changed and provide a means for optional profile control.

Example 6

Four wafers were spin coated with an experimental positive-tone resist EB-P3247 (Shin-Etsu Chemical) and baked at PAB=110° C. giving a film thickness of 100 nm. The coated wafers were patternwise exposed with a 248 nm (KrF) stepper and baked at a PEB=110° C. The four wafers were processed in four different ways:
Wafer 1) Develop in 0.26N TMAH for 30 seconds and rinsed in water 10 seconds—standard positive-tone development (PTD) for reference. N.B., brightfield exposure mask;
Wafer 2) Develop in methyl benzoate for 30 seconds, standard negative tone development (NTD);
Wafer 3) Rinse with 0.0065N TMAH rinse solution for 30 seconds and dry prior to development in methyl benzoate (MeB) for 30 seconds;
Wafer 4) Rinse with 0.0065N TMAH for 30 seconds, dry and subsequent rinse with deionized water (DI) for 5 seconds and dry again prior to development in methyl benzoate for 30 seconds.

Figures 6A, 6B, 6C, 6D:
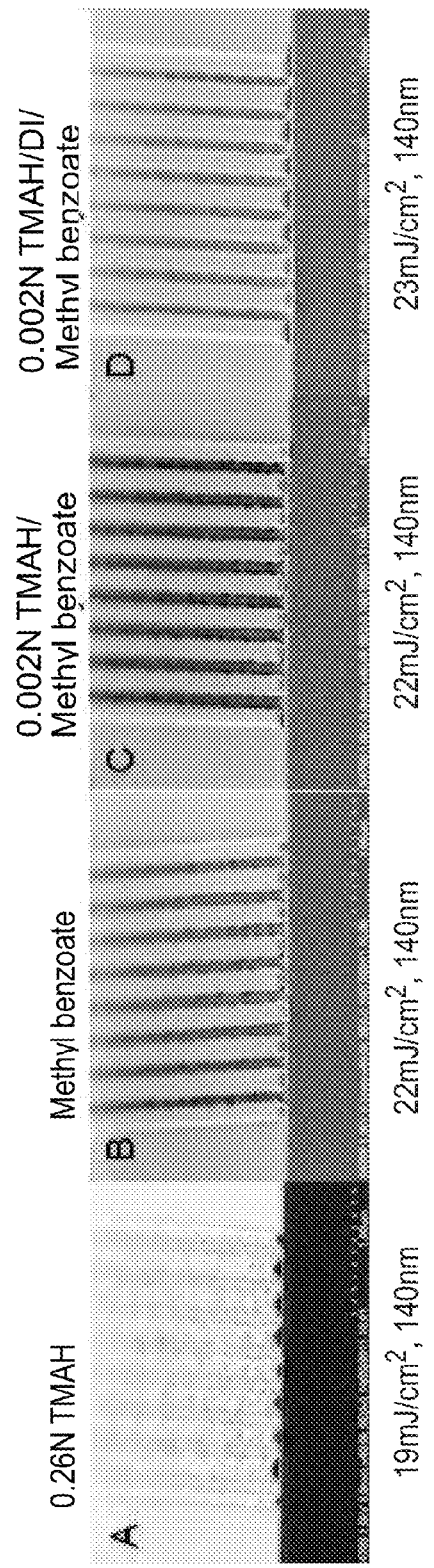
FIG. 6A to FIG. 6D illustrates 140 nm features (140 nm lines/140 nm spaces) of experimental resist exposed with 248 nm DUV (KrF), m with FIG. 6A a comparison of PTD using 0.26N TMAH, FIG. 6B NTD using methyl benzoate, FIG. 6C inventive process using 0.002N TMAH rinse then NTD using methyl benzoate, and FIG. 6 D inventive process with intermediate DI water rinse.

SEM images of the four wafers are illustrated in FIG. 6 with 140 nm features (140 nm line/140 nm space). The SEM images shows a side-by-side comparison of lithographic patterning performance of A) PTD using 0.26N TMAH developer, B) NTD using methyl benzoate, C) 0.002N TMAH rinse prior to NTD using methyl benzoate and D) 0.002N TMAH rinse with subsequent water rinse prior to NTD using methyl benzoate.

Example 7

Three wafers were spin coated with a positive-tone experimental photoresist EB-P3247 (Shin-Etsu Chemical) and baked at PAB=110° C. giving a film thickness of 70 nm. The coated wafers were exposed in a dose array with an Extreme ultraviolet (EUV) exposure tool at Lawrence Berkeley National Lab (LBNL) and baked at PEB=110° C. The three wafers were processed in three different ways:
Wafer 1) Develop in 0.26N TMAH for 30 seconds and rinsed in water 10 seconds—Standard positive-tone development (PTD) for reference;
Wafer 2) Develop in methyl benzoate (MeB) for 30 seconds, standard negative tone development (NTD) for reference;

Wafer 3) Rinse with 0.0016N TMAH rinse solution for 30 seconds and dry prior to development in methyl benzoate (MeB) for 30 seconds.

Figure 7:
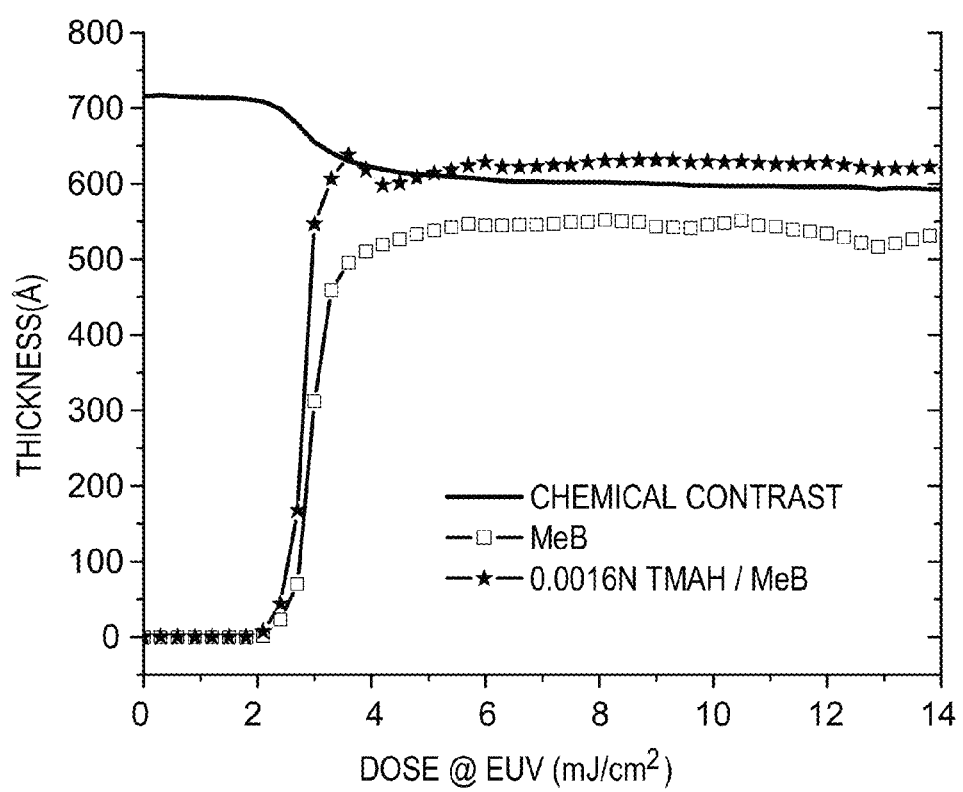

EUV contrast curves for wafers 2 and 3 in Example 7 are shown in FIG. 7. The positive-tone contrast curve for wafer 1 was omitted for clarity. The rinse process using 0.0016N TMAH prior to NTD with methyl benzoate reduces the resist toploss (thickness loss). This experiment shows the versatility that the described rinse process can also be beneficial in EUV exposures.

Example 8

Two wafers were spin coated with an experimental positive-tone resist EB-P3247 (Shin-Etsu Chemical) and baked at PAB=110° C. giving a film thickness of 50 nm. The coated wafers were patternwise exposed with an EUV exposure tool at LBNL and baked at a PEB=110° C. The two wafers were processed as follows:
Wafer 1) Develop in methyl benzoate for 30 seconds, standard negative tone development (NTD);
Wafer 2) Rinsed in 0.002N TMAH rinse solution for 30 seconds and dry prior to rinse in DI-water for 5 seconds and dry again prior to development in methyl benzoate for 30 seconds (invention).

Figure 8B:
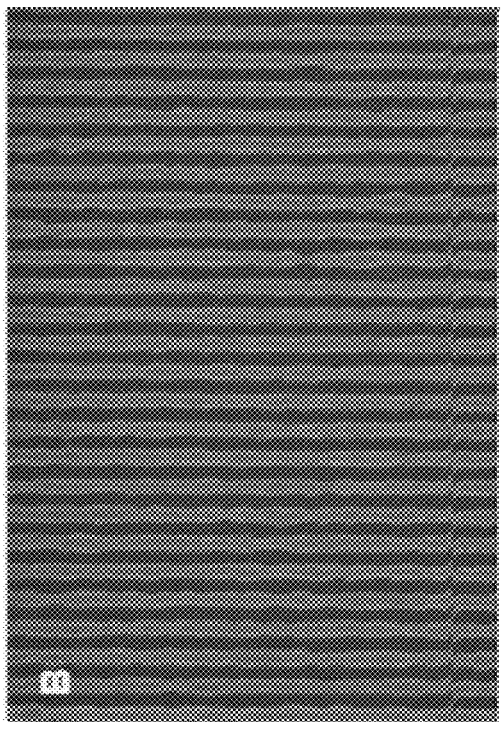
FIG. 8A and FIG. 8B illustrate 22 nm features by EUV imaging of an experimental resist, developed as shown in FIG. 8A with standard methyl benzoate NTD develop (dose 11.2 mJ/cm$^2$), and FIG. 8B using the process described in this invention: 0.002N TMAH rinse, DI-water rinse, and then methyl benzoate NTD develop (dose 12 mJ/cm$^2$)
Figure 8A:
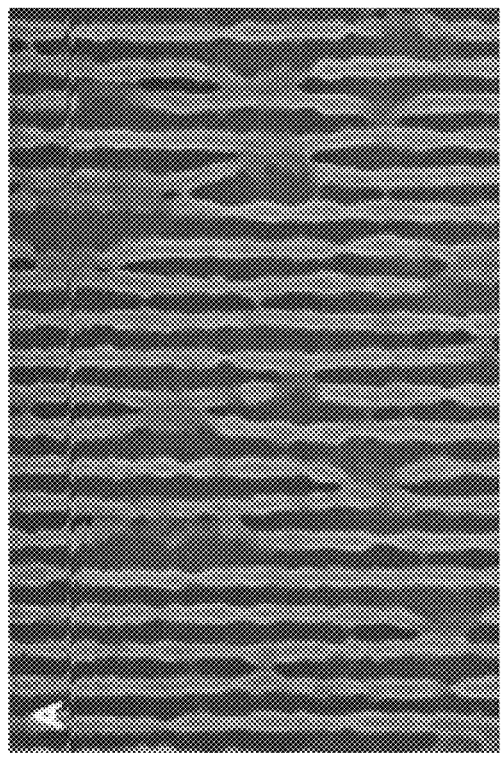

SEM images of the resulting resist patterns of Example 8 are pictured in FIG. 8 with 22 nm feature size (22 nm line/22 nm space). A) standard NTD in methyl benzoate, dose 11.2 mJ/cm2 and B) using process described in this invention: rinse with 0.002N TMAH solution followed by a DI-water rinse then development with methyl benzoate, dose 12 mJ/cm2. Improvement is observed using the TMAH rinse solution.

Example 9

A wafer was spin coated with an experimental positive-tone resist EB-P3247 (Shin-Etsu Chemical) and baked at PAB=110° C. giving a film thickness of 50 nm. The coated wafers were patternwise exposed with a Vistec Leica VB6 100 KeV e-beam exposure tool and baked at a PEB=110° C. The wafer was processed as follows:
Wafer 1) Rinse in 0.002N TMAH rinse solution for 30 seconds, dry and subsequent rinse with deionized water (DI) for 5 seconds and dry again prior to development in methyl benzoate for 30 seconds according to the process of the present invention.

Figures 9A, 9B:
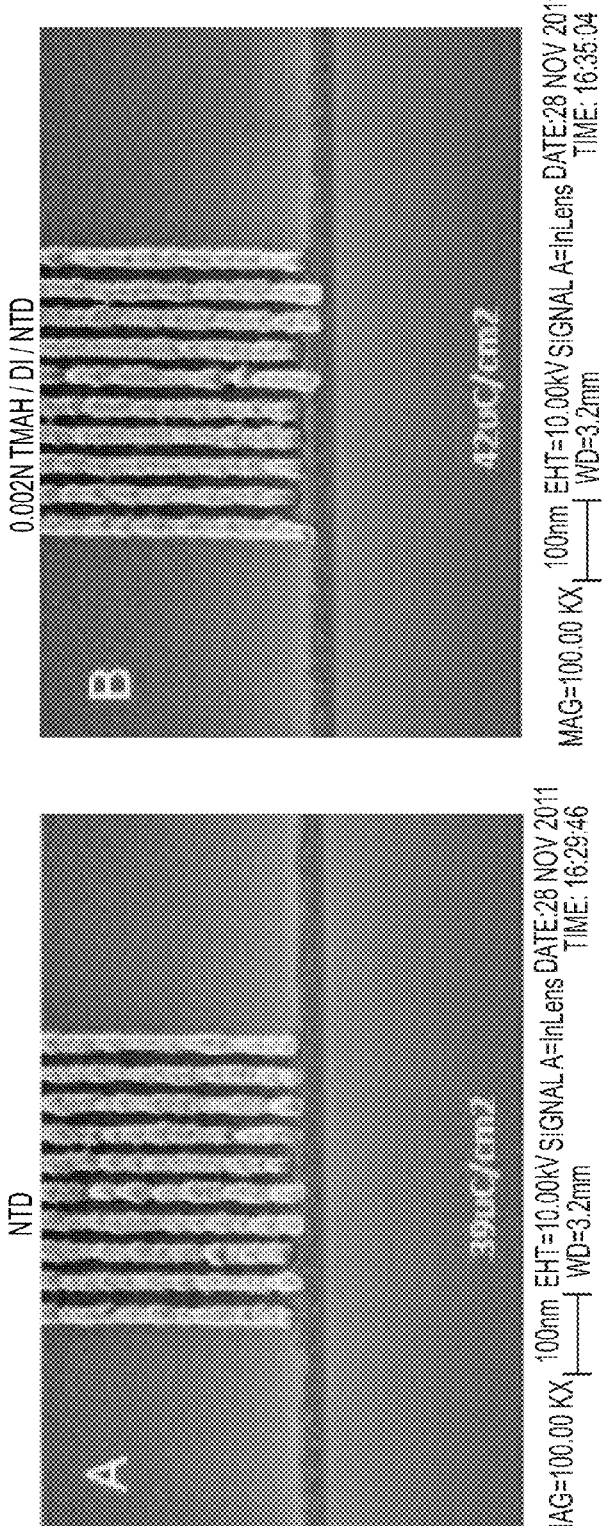
FIG. 9A and FIG. 9B illustrate e-beam exposure of 25 nm half pitch (HP) features (25 nm lines/25 nm spaces) of an experimental e-beam resist at, (FIG. 9A) 39 µC/cm², and (FIG. 9B) 42 µC/cm² using the process as described of this invention.
Figure 10:
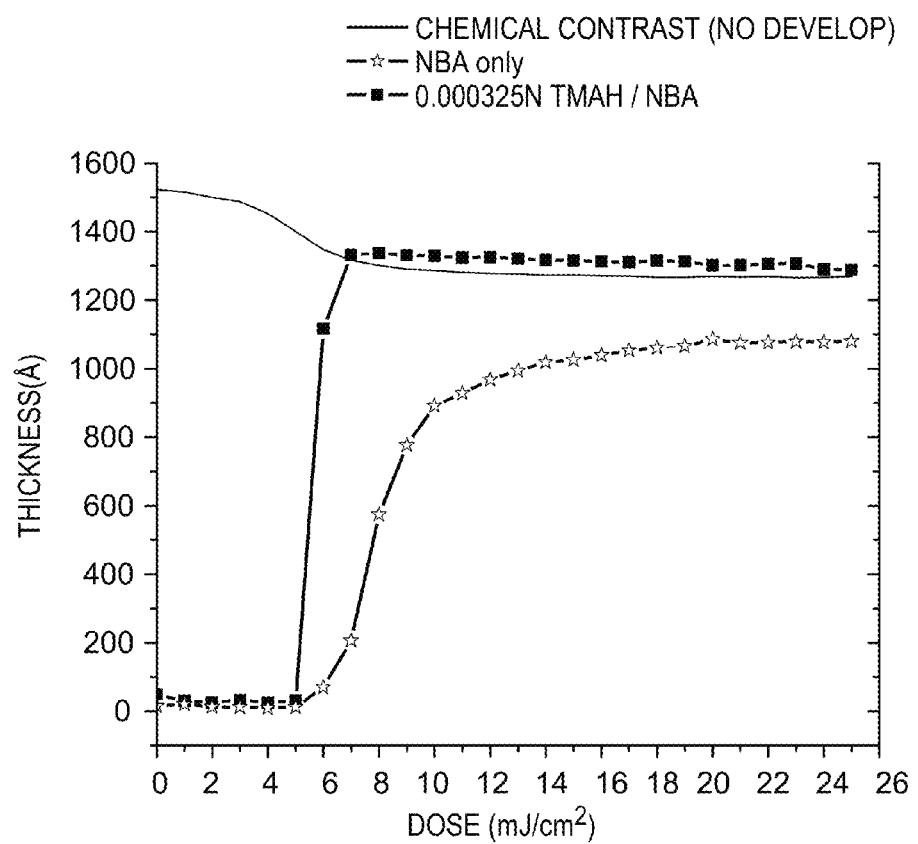

SEM images of resulting resist patterns of Example 9 are illustrated in FIG. 9 with 25 nm half-pitch (HP) features (25 nm line/25 nm space). The SEM images shows the good lithographic patterning performance obtained using the process described in this invention: 0.002N TMAH rinse solution followed by DI-water rinse and NTD using methyl benzoate, at 39 uC/cm² and 42 uC/cm² exposure dose respectively.

Example 10

Two wafers were spin coated with a positive-tone commercial 193 nm photoresist AR2073J (JSR Micro, Inc.), and baked at PAB=110° C. giving a film thickness of 140 nm. The coated wafers were exposed in a dose array with a 193 nm (ArF) stepper and thereafter baked at PEB=110° C. The two wafers were processed in two different ways:
Wafer 1) Develop in n-butyl acetate (NBA) for 30 seconds, standard negative tone development (NTD) for reference;
Wafer 2) Rinse with 0.000325N TMAH for 30 seconds and dry prior to development in n-butyl acetate (NBA) for 30 seconds.

The rinse process using 0.000325N TMAH prior to NTD with n-butyl acetate (NBA) boosts the contrast and reduces the resist toploss (thickness loss). This experiment shows the versatility that the described rinse process can also be beneficial in 193 nm exposures and yet for another standard type NTD solvent, NBA.

A similar experiment (not shown) with the same resist material was carried out using a 1 Molar (M) $Zn(OAc)_2$ aqueous rinse prior to NTD using methyl benzoate. Again, the $Zn(OAc)_2$ rinse process resulted in less resist toploss and higher contrast after NTD as opposed to the standard NTD process using methyl benzoate.

Example 11

Two wafers were spin coated with a positive-tone commercial 193 nm photoresist AR2073J-14 (JSR Micro, Inc.), and baked at PAB=110° C. giving a film thickness of 175 nm. The coated wafers were exposed in a dose array with a 193 nm (ArF) stepper and thereafter baked at PEB=110° C. The two wafers were processed in two different ways:
Wafer 1) Develop in n-butyl acetate (NBA) for 30 seconds, standard negative tone development (NTD) for reference;
Wafer 2) Vapor phase treatment for 30 seconds in saturated ammonia (vapor $NH_3$) prior to development in n-butyl acetate (NBA) for 30 seconds.

Figure 12:
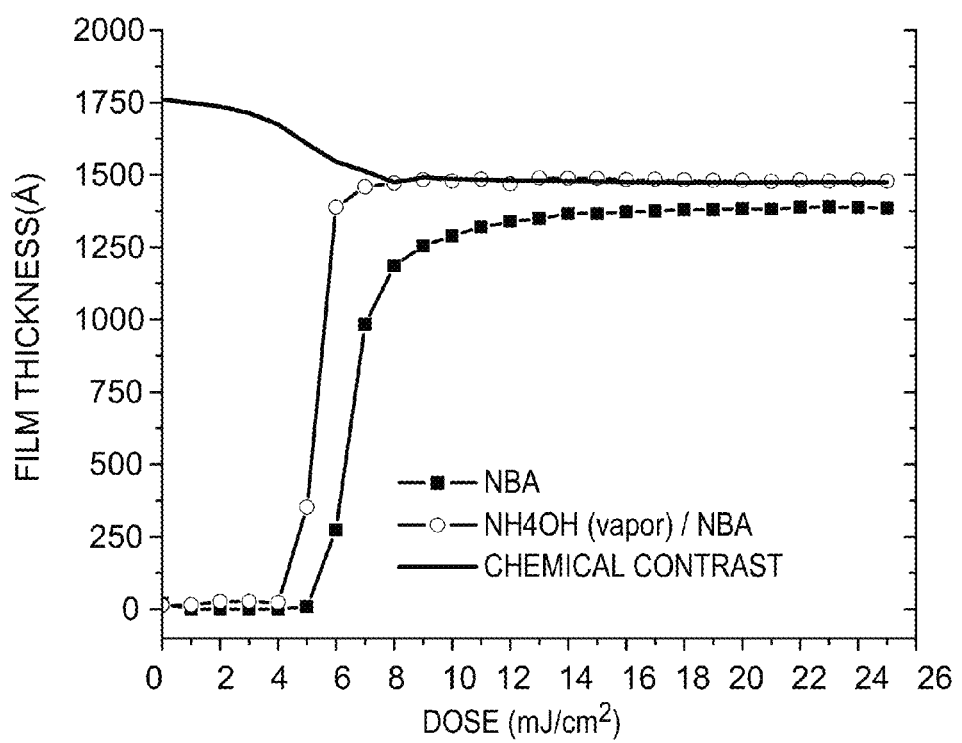

The contrast curve results of wafers in Example 12 are shown in FIG. 12. This experiment shows versatility that the described invention can also be beneficial using vapor phase treatment for improved contrast and reduced toploss.

Example 12

Five silicon wafers were prepared with a positive-tone commercial EUV photoresist, SEVR-139 (Shin-Etsu Chemical). The resist were spincoated to a 90 nm film thickness on silicon wafers precoated with AR3 (BARC) from Brewer Science. The resist coated wafers were post-applied baked (PAB) at 110° C. followed by a dose array exposure using a 248 nm (KrF) ministepper and post-expose bake (PEB) at 110° C. The five wafers were developed in different solvents:
Wafer 1) Pure 2-heptanone for 30 seconds;
Wafer 2) 0.13N TMAH in 4-methyl-2-pentanone (4M2P)/2-heptanone (ratio 5:1 by volume) for 30 seconds;
Wafer 3) 0.12 N tetraethylammonium hydroxide (TEAH) in 4M2P/2-heptanone 5:1 (ratio 5:1 by volume) for 30 seconds;
Wafer 4) 0.19N butyltrimethylammonium hydroxide (BTMAH) in 4M2P/2-heptanone (ratio 5:1 by volume) for 30 seconds;
Wafer 5) 0.26N TMAH for 30 seconds and rinsed in water for 10 seconds—standard positive-tone development (PTD) for reference.

Figure 11:
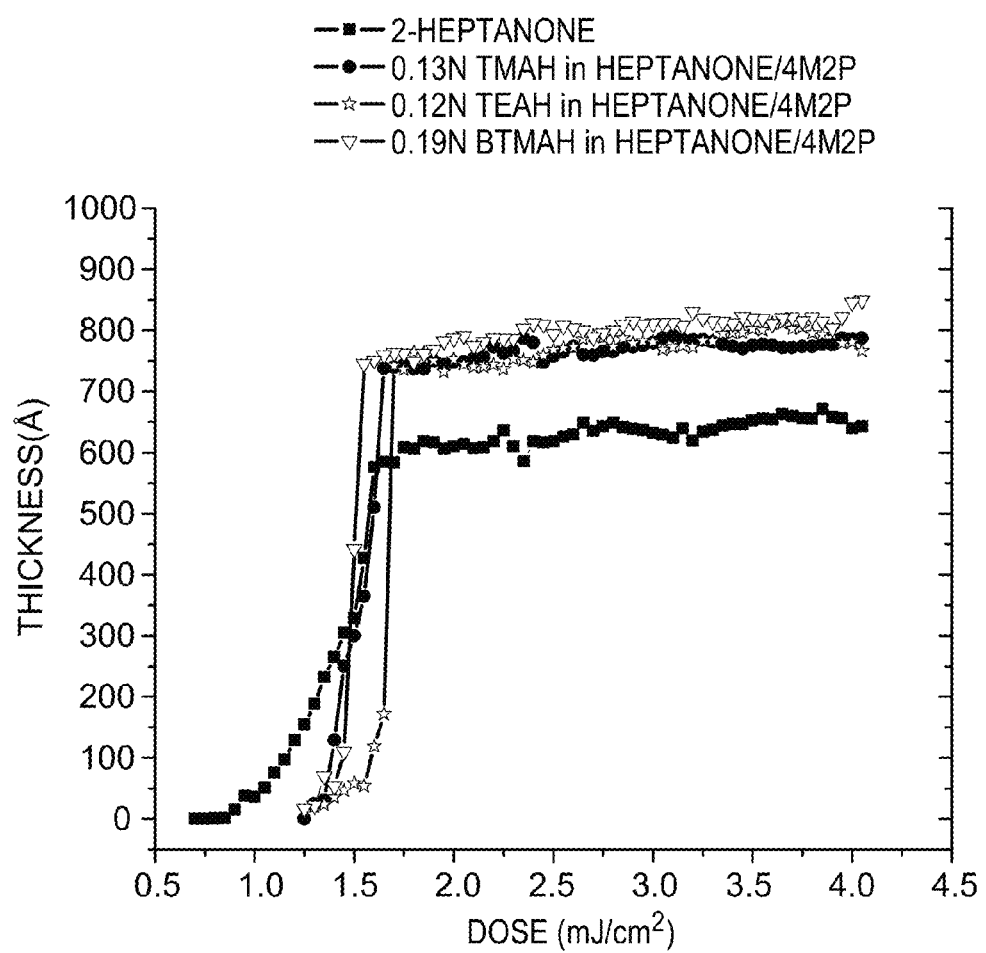

The contrast curve results of wafers 1-4 in Example 12 are shown in FIG. 11. The positive-tone contrast curve for wafer 5 was omitted for clarity. It can be seen that using this one-step procedure with a tetraalkylammonium hydroxide-containing organic developer, absence of footing (i.e., clean dissolution of the interfacial resist region in contact with the underlying film), and reduced top loss (thickness loss).

Good contrast was obtained for base concentrations ranging from about 0.12 mol/dm³ to about 0.19 mol/dm³ for solvent blends of 2-heptanone/4M2P. A wide range of base concentrations comprises about 0.07N to about 0.23N or a range falling within these limits comprising about 0.12 mol/dm³ to about 0.19 mol/dm³. The solvent blend mass ratio (2-heptanone:4M2P) comprises about (1:10) to about (1:1) or about (1:7) to about (1:3).

By using the process of the invention a resist that would not function in a negative-tone development process using known organic solvent developers such as MeB NBA or EEP instead can be considered for negative tone applications. Again, FIG. 1 illustrates rinsing a poly(tert-butoxycarbonylstyrene) (PBOCST) photoresist with low concentration aqueous TMAH prior to organic solvent development renders the resist insoluble to the organic solvent developer at a certain exposure dose thereby creating a high contrast negative tone resist.

The improved contrast illustrated for the model resist seen in FIG. 1 can be demonstrated in an imaging system based on similar chemistry with KRS-XE, a ketal protected poly hydroxystyrene, high performance e-beam positive-tone resist that is not functional in a common NTD solvent such as MeB. Pre-rinsing the exposed film with 0.0065 N TMAH improved the contrast and made this a functioning negative tone resist (see FIG. 2). See also 248 nm imaging result in FIG. 3a and FIG. 3b where we respectively compare development of KRS-XE without and with the rinse of the present invention.

In addition to improving the resist contrast, FIG. 4 shows that the rinse can also be employed to minimize or eliminate the film loss in positive-tone resists that already function as NTD resists.

Examples in FIGS. 4 through 6 demonstrate that a benefit could be achieved by rinsing the resist with DI-water after the dilute TMAH rinse but before the organic NTD processing step; 248 nm patterns in FIG. 6 show reduced toploss and improved adhesion using the intermittent DI-water rinse.

Other examples shown in FIGS. 7 and 8 illustrate the versatility of the described process, which can also be used in EUV exposure and retain the benefits. Likewise, FIG. 9 illustrates the good results using e-beam exposure and FIG. 10 using 193 nm exposure.

Example 11 illustrates the second embodiment which additionally demonstrates that a vapor phase treatment prior to NTD (solvent develop) can benefit with improved contrast and reduced toploss.

Finally, FIG. 12 demonstrates a one-step process described in the third embodiment, in which improved contrast and reduced thickness loss can be achieved by a modified solvent developer containing tetraalkylammonium hydroxide.

Other aspects of the invention comprise:

a process of producing negative-tone photoresist patterns using a photoresist developed with an organic solvent developer comprising the steps of:

(a) providing a photoresist film that can be processed to generate acidic sites;

(b) irradiating the photoresist film with radiant energy to provide an irradiated film having exposed and unexposed regions in the film, the exposed regions comprising imaged sites;

(c) optionally baking the irradiated film at elevated temperatures to produce a baked irradiated film comprising the imaged sites:

(d) the imaged sites comprise acidic sites formed after the irradiating or both the irradiating and the baking;

(e) contacting the irradiated film with a basic compound, without dissolving the film, to form a base treated film;

(f) optionally rinsing the base treated film in water or other solvent;

(g) developing the treated film with an organic solvent developer that substantially dissolves regions of the film that have not been exposed to the radiant energy to produce a negative-tone image.

The process set out in paragraph [0084.1] wherein the photoresist film is on a substrate comprising a wafer.

The process set out in paragraph [0084.1] 1 comprising a Bronsted base as the basic compound and comprises ammonia, hydroxyl amine, an organic amine, or a metal based compound.

The process set out in paragraph[0084.1] wherein the basic compound comprises inorganic Bronsted bases.

The process set out in paragraph [0084.1] wherein the basic compound comprises an inorganic compound based on the Group IA metals, Group IIA metals, Zinc or the Lanthanides dissolved in a solvent.

The process set out in paragraph [0084.1] wherein the basic compound comprises a dilute water solution or lower alkanol solution of NaOH, KOH, or LiOH.

The process set out in paragraph[0084.1] wherein the basic compound comprises organic Bronsted bases.

The process set out in paragraph[0084.1] wherein the basic compound comprises ionic organic Bronsted bases.

The process set out in paragraph [0084.7] wherein the organic Bronsted bases comprise a quaternary ammonium compound $R_4N^+OH^-$ where R comprises an organo group having from 1 up to about 18 carbon atoms comprising an alkyl, aromatic, or alkyl substituted aromatic group, combinations of the R groups, and combinations of the quaternary ammonium compounds.

The process set out in paragraph [0084.9] 9 wherein the quaternary ammonium compound comprises one of TMAH, TEAH, BTMAH. BTEAH, TBAH, HDTMAH, and combinations thereof.

The process set out in paragraph [0084.1] wherein the basic compound comprises non-ionic organic Bronsted N-bases.

The process set out in paragraph [0084.1] wherein the basic compound is a vapor or a gas or combinations thereof.

The process set out in paragraph[0084.1]wherein the photoresist film comprises a polymer having an aromatic ring substituted with a group comprising an oxy group.

The process set out in paragraph[0084.1] wherein the photoresist polymer contains esters of carboxylic acids active in acidolysis reactions The process set out in paragraph [0084.1] wherein the photoresist polymer comprises PBOCST.

The process set out in paragraph [0084.1] wherein the photoresist polymer comprises a phenolic polymer.

The process of [0084.1] wherein the photoresist polymer comprises an acrylic polymer.

The process set out in paragraph [0084.1] 1 wherein the photoresist polymer comprises a poly (norbornene)-co-maleic anhydride polymer.

The process set out in paragraph[0084.1] wherein the solvent developer comprises an organic solvent selected from ethyl benzoate, Ethyl 3-ethoxypropionate, 2-Heptanone, 4-Methyl-2-pentanone, N-Butyl acetate, Anisole, Acetophenone and combinations thereof.

The invention also comprises a process of producing a negative-tone photoresist pattern using a photoresist developed with an organic solvent developer comprising the steps of:

(a) providing a photoresist film that can be processed to generate acidic sites;

(b) irradiating the photoresist film with radiant energy to provide an irradiated film having exposed and unexposed regions in the film, the exposed regions comprising imaged sites;

(c) optionally baking the irradiated film at elevated temperatures to produce a baked irradiated film comprising the imaged sites:

(d) the imaged sites comprise acidic sites formed after the irradiating or both the irradiating and the baking;

(e) developing the treated film with a solvent developer comprising an organic solvent developer in combination with a basic compound comprising a Bronsted base to preferentially remove regions of the film that have not been exposed to the radiant energy to produce a negative-tone image.

The process set out in paragraph [0084.20] wherein the photoresist film is on a substrate comprising a wafer.

The process set out in paragraph [0084.20] wherein the organic Bronsted bases comprise a quaternary ammonium compound $R_4OH^-$ where R comprises an organo group having from 1 up to about 18 carbon atoms comprising an alkyl, aromatic, or alkyl substituted aromatic group, combinations of the R groups, and combinations of the quaternary ammonium compounds.

The process set out in paragraph [0084.20] wherein the quaternary ammonium compound comprises one of TMAH, TEAH, BTMAH. BTEAH, TBAH, HDTMAH, and combinations thereof.

The process set out in paragraph [0084.20] wherein the solvent developer comprises an organic solvent selected from Methyl benzoate, Ethyl 3-ethoxypropionate, 2-Heptanone, 4-Methyl-2-pentanone, N-Butyl acetate, Anisole, Acetophenone and combinations thereof.

The process set out in paragraph [0084.20 ]comprising about 0.12 mol/dm$^3$ to about 0.19 mol/dm$^3$ of the basic compound and the solvent developer comprises a combination of 2 solvents in a solvent blend mass ratio of about 1:10 to about 1:1.

The process set out in paragraph [0084.24] comprising about 0.12 mol/dm$^3$ to about 0.19 mol/dm$^3$ of the basic compound and the solvent developer comprises a combination of 2 solvents in a solvent blend mass ratio of about 1:10 to about 1:1.

The process set out in paragraph [0084.20] wherein the basic compound comprises a quaternary ammonium compound of the formula $R_4OH^-$ wherein R comprises an organo group having from 1 up to about 18 carbon atoms comprising an alkyl, aromatic, or alkyl substituted aromatic group, and combinations of the R groups, and combinations of the quaternary ammonium compounds.

The process set out in paragraph [0084.20] wherein the basic compound comprises a quaternary ammonium compound comprising one of TMAH, TEAH, BTMAH. BTEAH, TBAH, HDTMAH, and combinations thereof.

The process set out in paragraph [0084.20] wherein the basic compound comprises an inorganic compound based on the Group IA metals, Group IIA metals, Zinc or the Lanthanides dissolved in a solvent.

The process set out in paragraph [0084.20] wherein the basic compound comprises NaOH, KOH, or LiOH.

The process set out in paragraph [0084.20] wherein the photoresist film comprises a polymer having an aromatic ring substituted with a group comprising an oxy group.

The process set out in paragraph [0084.20] wherein the photoresist polymer comprises PBOCST.

The process set out in paragraph [0084.20] wherein the photoresist polymer comprises a phenolic polymer.

The process set out in paragraph [0084.20] wherein the photoresist polymer comprises an acrylic polymer.

The process set out in paragraph [0084.20] wherein the photoresist polymer comprises a poly (norbornene)-co-maleic anhydride polymer.

The process set out in paragraph [0084.20] wherein the basic compound is non-metallic and in the gaseous or vaporous phase.

The process set out in paragraph [0084.20] wherein the organic solvent and the Bronsted base are selected so that a chemical polarity change can occur in imaged sites comprising the acidic sites at a rate faster than the rate of film dissolution and development in order to increase contrast.

A photoresist article of manufacture comprising a photoresist polymer having photo generated acidic sites reacted with a basic compound comprising at least one of ammonia, hydroxyl amine, an organic amine, or a metal based compound and combinations thereof.

In yet another embodiment, the invention comprises a developer composition of matter for developing a film having negative tone photoresist patterns comprising acidic imaged sites that can be chemically modified by a basic compound, the developer comprising an organic solvent selected from Methyl benzoate, Ethyl 3-ethoxypropionate, 2-Heptanone, 4-Methyl-2-pentanone, N-Butyl acetate, Anisole, Acetophenone and combinations thereof admixed with a basic compound.

The composition set out in paragraph [0084.39] wherein the solvent includes a compound comprising a basic compound.

The composition set out in paragraph [0084.39] wherein the basic compound comprises ammonia, hydroxyl amine, an organic amine, or a metal based compound.

The composition set out in paragraph [0084.39] wherein the basic compound comprises inorganic Bronsted bases.

The composition set out in paragraph [0084.39] wherein the basic compound comprises an inorganic hydroxide based on the Group IA metals, Group IIA metals, Zinc or the Lanthanides.

The composition set out in paragraph [0084.39] wherein the basic compound comprises NaOH, KOH, LiOH.

The composition set out in paragraph [0084.39] wherein the basic compound comprises ionic organic Bronsted bases.

The composition set out in paragraph [0084.39] wherein the basic compound comprises non-ionic organic Bronsted N-bases.

The composition set out in paragraph [0084.39] wherein the organic Bronsted bases comprise a quaternary ammonium compound $R_4OH^-$ where R comprises an organo group having from 1 up to about 18 carbon atoms comprising an alkyl, aromatic, or alkyl substituted aromatic group, combinations of the R groups, and combinations of the quaternary ammonium compounds.

The composition set out in paragraph [0084.47] wherein the quaternary ammonium compound comprises one of TMAH, TEAH, BTMAH. BTEAH, TBAH, HDTMAH, and combinations thereof.

The composition set out in paragraph [0084.39] wherein the basic compound comprises polyvalent organic or inorganic Bronsted bases.

The composition set out in paragraph [0084.39] wherein the concentration of the developer solvent in combination with the base compound comprises concentration from about 0.00001 normal to about 0.23 normal.

The composition set out in paragraph [0084.39] where the basic compound comprises amines or ammonia.

The composition set out in paragraph [0084.39] further including a material comprising a surfactant.

The composition set out in paragraph [0084.39] comprising 2-Heptanone or 4-Methyl-2-pentanone and combinations thereof The composition set out in paragraph [0084.39] wherein the organic solvent and the basic compound are selected so that salt formation in the film occurs faster than the rate of film dissolution and development.

The process set out in paragraph [0084.19] wherein the photoresist polymer comprises a polymer having an aromatic ring substituted with a group comprising an oxy group.

The process set out in paragraph [0084.19] wherein the photoresist polymer comprises PBOCST.

The process set out in paragraph [0084.19] wherein the photoresist polymer comprises a ketal protected poly (hydroxystyrene) positive-tone photoresist polymer.

The process set out in paragraph [0084.19] wherein the solvent comprises 4-Methyl-2-pentanone.

The process set out in paragraph [0084.24] wherein the photoresist polymer comprises a polymer having an aromatic ring substituted with a group comprising an oxy group.

The process set out in paragraph [0084.24] wherein the photoresist polymer comprises PBOCST.

The process set out in paragraph [0084.24] wherein the photoresist polymer comprises a ketal protected poly(hydroxystyrene) positive-tone photoresist polymer.

The process set out in paragraph [0084.24] wherein the solvent comprises 4-Methyl-2-pentanone.

The process set out in paragraph [0084.1] wherein the solvent developer is in the gaseous or vaporous state.

The process set out in paragraph [0084.19] wherein the solvent developer is in the gaseous or vaporous state.

The process of the invention also comprises producing negative-tone photoresist patterns using a photoresist developed with an organic solvent developer comprising the steps of:

(a) providing a photoresist film that can be processed to generate acidic sites wherein the photoresist film comprises, a phenolic resin, or a photoresist polymer selected from a polymer having an aromatic ring substituted with a group comprising an oxy group, PBOCST;

(b) irradiating the photoresist film with radiant energy to provide an irradiated film having exposed and unexposed regions in the film, the exposed regions comprising imaged sites;

(c) optionally baking the irradiated film at elevated temperatures to produce a baked irradiated film comprising the imaged sites:

(d) the imaged sites comprise acidic sites formed after the irradiating or both the irradiating and the baking;

(e) contacting the irradiated film with a basic compound comprising a Bronsted base, without dissolving the film, to form a base treated film;

(f) developing the treated film with an organic solvent developer that substantially dissolves regions of the film that have not been exposed to the radiant energy to produce a negative-tone image, wherein the solvent developer is in the gaseous or vaporous state.

The process set out in paragraph paragraph [0084.65] wherein the solvent developer comprises an organic solvent selected from ethyl benzoate, Ethyl 3-ethoxypropionate, 2-Heptanone, 4-Methyl-2-pentanone, N-Butyl acetate, Anisole, Acetophenone and combinations thereof.

Broadly, the compounds of the invention described as having an "R" group or groups or an "organo substituent" or "organo substituents" comprise various organic and other moieties and also include organic or other moieties or substituents that can be further substituted with substituents; where these organic or other moieties, and/or substituents comprise inter alia, alkyl, aryl, halogens, such as fluorine, chlorine, bromine, or iodine, alkyloxy, alkyloxo, aryloxo, alkylcarbonyloxy, carboalkoxy, aryloxy, arylcarbonyloxy, or carboaryloxy group, carbonyl, nitro, cyano, halogen-substituted alkyl or halogen-substituted alkyloxy, substituted alkyl, alkylene, alicyclic, hydrocarbyl, cyclic alkyl(cycloaliphatic), hetero cycloaliphatic, aralkyl or alkaryl, acyl, acyloxy, alkylenoxy, such as defined inter alia by Allen et al., U.S. Pat. No. 7,193,023, col. 3, line 51 to col. 6, line 24, and Mizutani et al. U.S. Pat. No. 7,232,640, col. 8, line 54 to col. 12, line 14, and all other moieties and substituents defined by Allen et al. (supra), and/or Mizutani et al. (supra). For the purpose of this invention, the moieties and/or substituents also include combinations of moieties and/or substituents, such as two or more of the moieties and/or substituents. Allen et al., (supra) and Mizutani et al. (supra) give ranges of carbon atoms that apply to the various substituents and/or moieties of this invention and the following discussion applies to these ranges as well as the combinations of moieties and/or substituents.

Throughout this specification, and abstract of the disclosure, the inventors have set out equivalents, of various materials as well as combinations of elements, materials, compounds, compositions, conditions, processes, structures and the like, and even though set out individually, also include combinations of these equivalents such as the two component, three component, or four component combinations, or more as well as combinations of such equivalent elements, materials, compositions conditions, processes, structures and the like in any ratios or in any manner.

Additionally, the various numerical ranges describing the invention as set forth throughout the specification also includes any combination of the lower ends of the ranges with the higher ends of the ranges, and any single numerical value, or any single numerical value that will reduce the scope of the lower limits of the range or the scope of the higher limits of the range, and also includes ranges falling within any of these ranges.

The terms "about," "substantial," or "substantially" as applied to any claim or any parameters herein, such as a numerical value, including values used to describe numerical ranges, means slight variations in the parameter or the meaning ordinarily ascribed to these terms by a person with ordinary skill in the art. In another embodiment, the terms "about," "substantial," or "substantially," when employed to define numerical parameter include, e.g., a variation up to five per-cent, ten per-cent, or 15 per-cent, or somewhat higher.

All scientific journal articles and other articles, including internet sites, as well as issued and pending patents that this written description or applicants' Invention Disclosure Statements mention, including the references cited in such scientific journal articles and other articles, including internet sites, and such patents, are incorporated herein by reference in their entirety and for the purpose cited in this written description and for all other disclosures contained in such scientific journal articles and other articles, including internet sites as well as patents and the references cited in any of the foregoing, as all or any one may bear on or apply in whole or in part, not only to the foregoing written description, but also the following claims, abstract of the disclosure, and drawings.

Although the inventors have described their invention by reference to some embodiments, other embodiments defined by the doctrine of equivalents are intended to be included as falling within the broad scope and spirit of the foregoing written description, the following claims, abstract of the disclosure, and drawings.

We claim:

1. A process of producing negative-tone photoresist patterns using a photoresist developed with an organic solvent developer comprising the steps of:
   (a) providing a photoresist film that can be processed to generate acidic sites wherein said photoresist film comprises a photoresist polymer selected from a polymer having an aromatic ring substituted with a group comprising an oxy group, PBOCST, or a phenolic resin;
   (b) irradiating said photoresist film with radiant energy to provide an irradiated film having exposed and unexposed regions in said film, said exposed regions comprising imaged sites;
   (c) optionally baking said irradiated film at elevated temperatures to produce a baked irradiated film comprising said imaged sites:
   (d) said imaged sites comprise acidic sites formed after said irradiating or both said irradiating and said baking;
   (e) contacting said irradiated film with a basic compound comprising a Bronsted base, without dissolving said film, to form a base treated film;
   (f) rinsing said base treated film in water or other solvent;
   (g) developing said treated film with an organic solvent developer that substantially dissolves regions of said film that have not been exposed to said radiant energy to produce a negative-tone image.

2. The process of claim 1 wherein said photoresist film is on a substrate comprising a wafer.

3. The process of claim 1 said basic compound comprises ammonia, hydroxyl amine, an organic amine, or a metal based compound.

4. The process of claim 1 wherein said basic compound comprises an inorganic compound based on the Group IA metals, Group IIA metals, Zinc or the Lanthanides dissolved in a solvent.

5. The process of claim 1 wherein said Bronsted base comprises a quaternary ammonium compound $R_4N^+OH^-$ where R comprises an organo group having from 1 up to about 18 carbon atoms comprising an alkyl, aromatic, or alkyl substituted aromatic group, combinations of said R groups, and combinations of said quaternary ammonium compounds.

6. The process of claim 1 wherein said basic compound is non-metallic and in the gaseous or vaporous phase.

7. The process of claim 1 wherein said solvent developer comprises an organic solvent selected from ethyl benzoate, Ethyl 3-ethoxypropionate, 2-Heptanone, 4-Methyl-2-pentanone, N-Butyl acetate, Anisole, Acetophenone and combinations thereof.

8. The process of claim 7 wherein said photoresist polymer comprises a polymer having an aromatic ring substituted with a group comprising an oxy group.

9. The process of claim 7 wherein said photoresist polymer comprises PBOCST.

10. The process of claim 7 wherein said photoresist polymer comprises a ketal protected poly(hydroxystyrene) positive-tone photoresist polymer.

11. The process of claim 7 wherein said photoresist polymer comprises a phenolic polymer.

12. The process of claim 7 wherein said solvent developer is in the gaseous or vaporous state.

13. The process of claim 1 wherein said solvent developer is in the gaseous or vaporous state.

14. A process of producing a negative-tone photoresist pattern using a photoresist developed with an organic solvent developer comprising the steps of:
   (a) providing a photoresist film that can be processed to generate acidic sites wherein said photoresist film comprises a photoresist polymer selected from a polymer having an aromatic ring substituted with a group comprising an oxy group, PBOCST, or a phenolic resin;
   (b) irradiating said photoresist film with radiant energy to provide an irradiated film having exposed and unexposed regions in said film, said exposed regions comprising imaged sites;
   (c) optionally baking said irradiated film at elevated temperatures to produce a baked irradiated film comprising said imaged sites:
   (d) said imaged sites comprise acidic sites formed after said irradiating or both said irradiating and said baking;
   (e) developing said treated film with a solvent developer comprising an organic solvent developer in combination with a basic compound comprising a Bronsted base to preferentially remove regions of said film that have not been exposed to said radiant energy to produce a negative-tone image; wherein said solvent developer comprises an organic solvent selected from ethyl benzoate, 4-Methyl-2-pentanone, N-Butyl acetate, Anisole, Acetophenone and combinations thereof.

15. The process of claim 14 wherein said photoresist film is on a substrate comprising a wafer.

16. The process of claim 14 wherein said Bronsted base comprises a quaternary ammonium compound $R_4N^+OH^-$ where R comprises an organo group having from 1 up to about 18 carbon atoms comprising an alkyl, aromatic, or alkyl substituted aromatic group, combinations of said R groups, and combinations of said quaternary ammonium compounds.

17. The process of claim 14 wherein said basic compound comprises ammonia, hydroxyl amine, an organic amine, or a metal based compound.

18. The process of claim 14 wherein said Bronsted base comprises an inorganic compound based on the Group IA metals, Group IIA metals, Zinc or the Lanthanides dissolved in a solvent.

19. The process of claim 14 wherein said basic compound is non-metallic and in the gaseous or vaporous phase.

20. The process of claim 14 wherein said the organic solvent and said Bronsted base are selected so that a chemical polarity change can occur in imaged sites comprising said acidic sites at a rate faster than the rate of film dissolution and development in order to increase contrast.

21. The process of claim 14 wherein said photoresist polymer comprises a polymer having an aromatic ring substituted with a group comprising an oxy group.

22. The process of claim 14 wherein said photoresist polymer comprises PBOCST.

23. The process of claim 14 wherein said photoresist polymer comprises a ketal protected poly(hydroxystyrene) positive-tone photoresist polymer.

24. A composition of matter comprising a photoresist polymer selected from a polymer having an aromatic ring substituted with a group comprising an oxy group, or PBOCST, or a ketal protected poly(hydroxystyrene) positive-tone photoresist polymer, and an organic solvent selected from Methyl benzoate, 4-Methyl-2-pentanone, N-Butyl acetate, Anisole, Acetophenone and combinations thereof admixed with a basic compound comprising a Bronsted base.

25. The composition of claim 24 wherein said basic compound comprises ammonia, hydroxyl amine, an organic amine, or a metal based compound.

26. The composition of claim 24 wherein said basic compound comprises an inorganic hydroxide based on the Group IA metals, Group IIA metals, Zinc or the Lanthanides.

27. The composition of claim 24 wherein said Bronsted bases comprise a quaternary ammonium compound $R_4N^+$ $OH^-$ where R comprises an organo group having from 1 up to about 18 carbon atoms comprising an alkyl, aromatic, or alkyl substituted aromatic group, combinations of said R groups, and combinations of said quaternary ammonium compounds.

28. The composition of claim 24 further including a material comprising a surfactant.

29. A process of producing negative-tone photoresist patterns using a photoresist developed with an organic solvent developer comprising the steps of:
   (a) providing a photoresist film that can be processed to generate acidic sites wherein said photoresist film comprises a photoresist polymer selected from a polymer having an aromatic ring substituted with a group comprising an oxy group, PBOCST, or a phenolic resin;
   (b) irradiating said photoresist film with radiant energy to provide an irradiated film having exposed and unexposed regions in said film, said exposed regions comprising imaged sites;
   (c) optionally baking said irradiated film at elevated temperatures to produce a baked irradiated film comprising said imaged sites:
   (d) said imaged sites comprise acidic sites formed after said irradiating or both said irradiating and said baking;
   (e) contacting said irradiated film with a basic compound comprising a Bronsted base, without dissolving said film, to form a base treated film;
   (f) developing said treated film with an organic solvent developer that substantially dissolves regions of said film that have not been exposed to said radiant energy to produce a negative-tone image, wherein said solvent developer is in the gaseous or vaporous state.

30. The process of claim 29 wherein said solvent developer comprises an organic solvent selected from ethyl benzoate, Ethyl 3-ethoxypropionate, 2-Heptanone, 4-Methyl-2-pentanone, N-Butyl acetate, Anisole, Acetophenone and combinations thereof.

\* \* \* \* \*